US012590107B2

(12) United States Patent
Dorok et al.

(10) Patent No.: US 12,590,107 B2
(45) Date of Patent: Mar. 31, 2026

(54) CERIUM (IV) COMPLEXES AND THEIR USE IN ORGANIC ELECTRONICS

(71) Applicant: CREDOXYS GmbH, Dresden (DE)

(72) Inventors: Sascha Dorok, Dresden (DE); Marcus Papmeyer, Nossen (DE); Leonard Eymann, Dresden (DE)

(73) Assignee: Credoxys GmbH, Dresden (DE)

( * ) Notice: Subject to any disclaimer, the term of this patent is extended or adjusted under 35 U.S.C. 154(b) by 972 days.

(21) Appl. No.: 17/641,129

(22) PCT Filed: Sep. 7, 2020

(86) PCT No.: PCT/EP2020/074918

§ 371 (c)(1),
(2) Date: Mar. 8, 2022

(87) PCT Pub. No.: WO2021/048044

PCT Pub. Date: Mar. 18, 2021

(65) Prior Publication Data

US 2023/0092935 A1 Mar. 23, 2023

(30) Foreign Application Priority Data

Sep. 11, 2019 (DE) ..................... 10 2019 213 844.6

(51) Int. Cl.

*C07F 5/00* (2006.01)
*C07C 49/92* (2006.01)
*H10K 30/20* (2023.01)
*H10K 30/50* (2023.01)
*H10K 50/15* (2023.01)
*H10K 85/30* (2023.01)

(52) U.S. Cl.

CPC ............... *C07F 5/00* (2013.01); *H10K 50/15* (2023.02); *H10K 85/351* (2023.02); *H10K 30/20* (2023.02); *H10K 30/50* (2023.02)

(58) Field of Classification Search

CPC ...... H10K 50/15; H10K 85/351; H10K 30/20; H10K 30/50; Y02E 10/549; C07F 5/00; C07C 49/92

See application file for complete search history.

(56) References Cited

U.S. PATENT DOCUMENTS

| | | | |
|---|---|---|---|
| 4,036,605 | A | 7/1977 | Hartle |
| 4,511,515 | A | 4/1985 | Thompson |
| 6,605,317 | B1 | 8/2003 | Kathirgamanathan |
| 7,183,008 | B1 | 2/2007 | Kathirgamanathan |
| 8,613,975 | B2 | 12/2013 | Chalker et al. |
| 2004/0149353 | A1 | 8/2004 | Hill |
| 2010/0038632 | A1 | 2/2010 | Ganeshamurugan et al. |
| 2016/0285016 | A1 | 9/2016 | Kwong |
| 2017/0117503 | A1 | 4/2017 | Mohan et al. |
| 2019/0221771 | A1 | 7/2019 | Mohan et al. |
| 2023/0354693 | A1 | 11/2023 | Yersin |

FOREIGN PATENT DOCUMENTS

| | | | |
|---|---|---|---|
| CN | 1335880 | A | 2/2002 |
| CN | 102617616 | A | 8/2012 |
| CN | 104673292 | A | 6/2015 |
| CN | 111302926 | A | 6/2020 |
| EP | 2180029 | A1 | 4/2010 |
| EP | 2297379 | A1 | 3/2011 |
| JP | S5232984 | A | 3/1977 |
| JP | H01256584 | A | 10/1989 |
| JP | H11302288 | A | 11/1999 |
| JP | 2012124252 | A | 6/2012 |
| JP | 2013006833 | A | 1/2013 |
| JP | 2017069280 | A | 4/2017 |
| JP | 2017141192 | A | 8/2017 |
| JP | 2018162399 | A | 10/2018 |
| WO | WO0026323 | A1 | 5/2000 |
| WO | 200218394 | A1 | 3/2002 |
| WO | WO2012161205 | A1 | 11/2012 |

OTHER PUBLICATIONS

Behrsing et al. Inorg. Chim. Acta. 2003, 352, 229-237. (Year: 2003).*

Baxter, I. et al., Preparation and crystal structures of the Ce(IV) β-diketonates, [Ce(tmhd)4] and [Ce(pmhd)4] (tmhd=2,2,6,6-tetramethylheptane-3,5-dionate and pmhd = 1-phenyl-5-methylhexane-1,3-dionate), Journal of Chemical Crystallography, 28(4): 267-276, 1998.

Brill, G. et al., Anisotropieeffekte in den 1H-NMR-Spektren 3-mesitylsubstituierter Acetylaceton-Metallchelate, 11, Liebigs Annalen der Chemie, S. 803-810, 1979.

Ciampolini, M. et al., Visible and Ultraviolet Spectra of Tetraethylammonium Tetrakis(β-diketonato)cerate(III) and Tetrakis(62-diketonato)cerium(IV) Complexes, J.C.S. Dalton: 1325-1328, 1977.

Delarosa, M. et al., Physical and Structural Characterization of Ce(IV) β-Diketonate Complexes: Evidence for Geometrical Isomers in the Solid-State, Journal of Coordination Chemistry, 55(7): 781, 2002.

Jahr et al., Metallchelate des Stearoylaretons, Zeitschrift für Chemie, Bd. 15, 280-281, 1975.

Kunkely, H., Excited state behavior of tetrakis(2,2,6,6-tetramethyl-3,5-heptane-dionato)cerium(IV) Emission and photoredox reaction from ligand-to-metal charge transfer states, Journal of Photochemistry and Photobiology A, 146 (1-2): 63-66, 2001.

(Continued)

*Primary Examiner* — Kamal A Saeed

*Assistant Examiner* — Sagar Patel

(74) *Attorney, Agent, or Firm* — Weston R. Gould; Dinsmore & Shohl LLP

(57) ABSTRACT

The present invention relates to an electronic component comprising a cerium IV complex, a doped semi-conductor matrix material comprising the cerium IV complex and at least one electron donor, the use of the cerium IV complex, especially as an organic semi-conductor, as a dopant in organic semiconductor matrix materials and as a charge injector in a charge injection layer, and new cerium IV complexes.

12 Claims, No Drawings

(56) References Cited

OTHER PUBLICATIONS

Pinnaviaia, T., Nuclear Magnetic Resonance Studies of Ligand Exchange for Some Group IVb β-Diketonates, Inorganic Chemistry, 5(2): 233-238, Feb. 1966.
Piro, N. et al., The electrochemical behavior of cerium(III/IV) complexes: Thermodynamics, kinetics and applications in synthesis, Coordination Chemistry Reviews, 260: 21-36, 2014.
Snezhko et al., Metal chelates of some β-diketones as volatile precursors, Material Science and Engineering, 18: 230-231, 1993.
Holleman, Wiberg, 101, Auflage, p. 1787, 1995 (English translation included).
STN Search Record, Sep. 25, 2023.
Stilinovic, V. et al., Two tetrakis(benzoylacetonato)lanthanide species: Synthesis, characterization and structures of tetrakis(benzoylacetonato)cerium(IV) and triethylammonium tetrakis(benzoylacetonato)lanthanate(III) tetrahydrate, Journal of Coordination Chemistry, 62(16): 2698-2708, Aug. 20, 2009.

* cited by examiner

CERIUM (IV) COMPLEXES AND THEIR USE IN ORGANIC ELECTRONICS

CROSS REFERENCE TO RELATED APPLICATIONS

This application is a U.S. National Stage under 35 U.S.C. § 371 of international patent application number PCT/EP2020/074918, which depends from and claims priority to German Application No: 10 2019 213 844.6 filed Sep. 11, 2019.

The present invention relates to electronically doped semiconductor materials and an electronic component comprising cerium (IV) complexes. A further object of the invention is the use of the cerium (IV) complexes as electron acceptors, especially as p-dopants and electron transport materials in organic electronic components. Another object of the invention are new cerium (IV) complexes.

BACKGROUND OF THE INVENTION

Organic electronics focuses on the development, characterization and application of new materials, both based on small organic molecules and polymers with certain desired electronic properties for the production of electronic components. These comprise e.g. organic field effect transistors (OFETs) such as organic thin film transistors (OTFTs), organic electroluminescent devices such as organic light emitting diodes (OLEDs), organic solar cells (OSCs), e.g. exciton solar cells, dye-sensitized solar cells (DSSCs) or perovskite solar cells, electrophotography, e.g. photoconductive materials in organic photoconductors (OPCs), organic optical detectors, organic photoreceptors, light-emitting electrochemical cells (LECs) and organic laser diodes.

It is known that organic semiconductor matrices can be heavily influenced regarding their electrical conductivity by doping. Such organic semiconductive matrix materials can be formed by either from compounds with good electron donor properties (p-conductor) or from compounds with good electron acceptor properties (n-conductor). In contrast to inorganic semiconductors, organic semiconductors have a very low intrinsic charge carrier concentration. Organic semi-conductor matrix materials are therefore usually doped in order to achieve good semiconductor properties. For n-doping strong electron donors (n dopants) are used, which transfer an electron to the LUMO of the semiconductor matrix (n-doping), resulting in a free electron on the matrix (SOMO). For p-doping strong electron acceptors (p-dopants) are used, which remove an electron from the HOMO of the semiconductor matrix (p-doping), resulting in a hole. In other words, for p-doping the LUMO of the dopant must be below the HOMO-energy of the matrix. The dopant acts as an acceptor and leaves a mobile hole (SOMO) in the matrix.

Known p-dopants for electron donor materials are electron acceptors such as tetracyanoquinone methane (TCNQ), 2,3,5,6-tetrafluorotetracyano-1,4-benzoquinone methane (F4TCNQ), trinaphthylenes (HATNA), metal oxides such as $MoO_3$ or $WO_3$, or radialene compounds as e.g. described in EP 2180029. The acceptor molecules generate so-called holes in the semiconductor matrix materials (hole transport materials) by electron transfer processes, and the conductivity of the semiconductor matrix material (hole transport material) is more or less changed depending on the number and mobility of the holes.

However, the previously described compounds or compound classes have disadvantages for a technical use in the production of doped semiconductors or of corresponding electronic components with such doped layers. The compounds or compound classes mentioned are, for example, too volatile, have a too high absorption coefficient, have an unstable evaporation rate and/or show low thermostability. In addition, some of these compounds have very high production costs.

Thus, there is still a demand for compounds, which are easily available or producible, are suitable for doping electron donor materials and do not have the disadvantages described above.

Only a few cerium (IV) complexes of the class of diketonates are known. A few β-diketonate complexes of cerium (IV) are described in the literature. M. Ciampolini et al., J. C. S. Dalton, 1977, 1325; T. J. Pinnaviaia et al., Contribution from the department of Chemistry, Cornell University, Ithaca, New York, 1965, 233; I. Baxter et al., J. Chem. Cryst, Vol. 28, No 4, 1998, 267; N. A. Piro et al., Coord. Chem. Review, 260, 2014, 21, M. Delarosa et al., J. Coord. Chem., 55(7), 2002, 781; Jahr et al., Zeitschrift für Chemie, Bd. 15, 1975, S 280-281; Snezhko et al. Material Science and Engineering, Vol. 18, 1993, S. 230-231; Brill et al., Liebigs Annalen der Chemie, 1979, S. 803-810 and WO02/018394 describe the following cerium (IV) complexes:

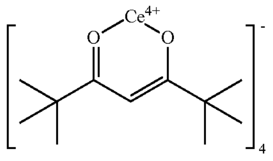
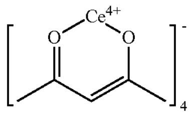

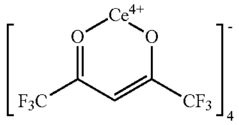

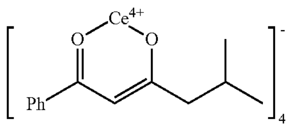
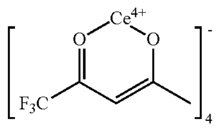

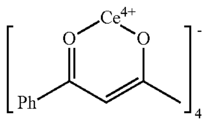
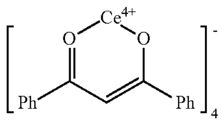

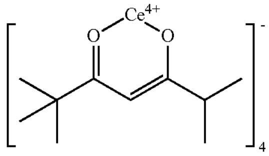

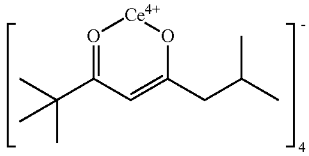

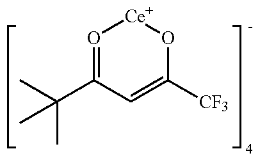
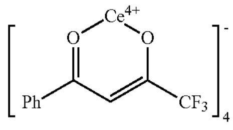

-continued

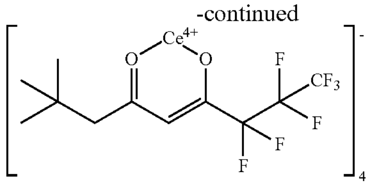

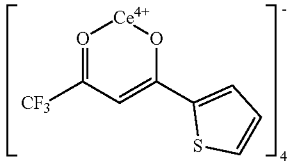

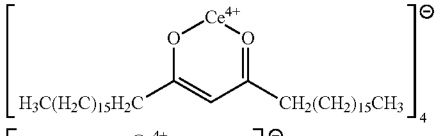

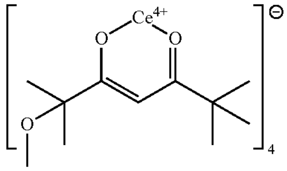

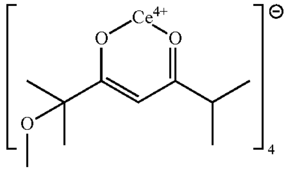

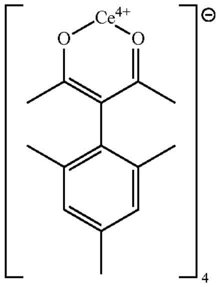

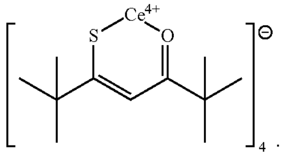

WO02/018394 relates to precursor source reagent metal-organic compositions. The formation of cerium doped (Ca, Sr)$Ga_2S_2$ films with thio-containing solvent systems and deposition in the presence of hydrogen sulfide gas is described.

Kunkely et al., Journal of Photochemistry and Photobiology A, Vol 146, No 1-2, p. 63-66 describes cerium (IV) 2,2,6,6-tetramethyl-3,5-heptane-dionate anion. It is further described that this complex has luminescent properties and is also photoactive. These properties are irrelevant for a p-dopant or for redox doping pairs of transport layers.

US 2010/0038632 describes a variety of complexes including cerium (IV) complexes. On the one hand explicit cerium (IV) complexes according to the invention are not mentioned. On the other hand, the large band gaps in cerium complexes mentioned in this document are not relevant for a p-dopant.

Until now, it was unknown to use cerium (IV) complexes in organic semiconductor materials. In particular, it has not yet been described to use cerium (IV) complexes as p-dopants, as electron transport materials or as electron acceptors.

Surprisingly, it has now been found that cerium (IV) complexes can be advantageously used as p-dopants. Furthermore, it has been found that cerium (IV) complexes can be used as electron transport materials (ETM) in organic electronic components such as organic light emitting diodes (OLED), photovoltaic cells, organic solar cells (OPV), organic diodes or organic transistors.

Furthermore, many cerium (IV) diketonates can be evaporated very well under vacuum and occasionally exhibit high thermostability. Thus, they are basically suitable for both variants of processing of organic-electronic components, the vacuum coating (vapour deposition) and the solvent-based processing (solution processing).

SUMMARY OF THE INVENTION

A first object of the invention is an electronic component comprising a compound of the general formula (I.1)

$$Ce^{4+}(L_1L_2L_3L_4)^{4-} \quad (I.1)$$

or a mixture of at least two different compounds of the general formula (I.1), wherein $L_1$; $L_2$; $L_3$; and $L_4$ are independently from each other selected from a bidentate ligand having the general formula (I.2)

(I.2)

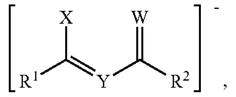

wherein

X and W independently from each other represent O, S or $NR^6$;

Y represents N or $CR^{3-}$;

$R^1$, $R^2$ independently from each other represent CN, $C_1$-$C_6$ alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl.

A further object of the invention is an electronic component comprising a compound of the general formula (I)

(I)

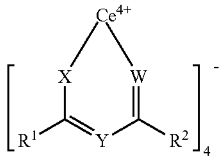

or a mixtures thereof, wherein

X and W independently from each other represent O, S or $NR^6$;

Y represents N or $CR^3$;

$R^1$, $R^2$ independently from each other represent CN, $C_1$-$C_6$ alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $N^{4b}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl.

A further object of the invention is an electronic component comprising a compound of the general formula (I)

(I)

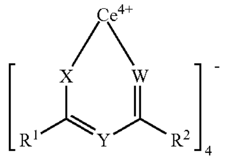

or mixtures thereof, wherein

X and W independently from each other represent 0, S or $NR^6$;

Y represents N or $CR^3$;

$R^1$, $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$.

A further object of the invention is a doped semiconductor matrix material comprising at least one electron donor and at least one compound of formula (I.1) or (I), wherein the radicals X, W, Y, $R^1$ and $R^2$ have the meanings given above and as defined below.

Another object of the invention is the use of a compound (I.1) or mixtures thereof or compound (I) or mixtures thereof, wherein the radicals X, W, Y, $R^1$ and $R^2$ have the meanings defined before and as defined below, as organic semiconductor, as doping agent in organic semiconductor matrix materials, especially as p-dopant in hole transport layers, as charge injector in a charge injection layer, as cathode material in organic batteries, as electrochromic material.

A further object of the invention is the use of Ce(III)-complex anions obtained by reduction of a compound (I.1)

or (I) as defined above and below or of charge transfer complexes of a compound (I.1) or (I), as defined above and below, with electron donors as organic conductor, as electrochromic material or as ferrimagnets.

A further object of the invention is a compound of the general formula (I.1)

$$Ce^{4+}(L_1L_2L_3L_4)^{4-} \quad (I.1),$$

and mixtures thereof, wherein $L_1$; $L_2$; $L_3$; and $L_4$ are independently from each other a bidentate ligand having the general formula (I.2)

(I.2)

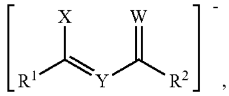

wherein

X and W independently from each other represent 0, S or $NR^6$;

Y represents N or $CR^3$;

$R^1$, $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_{6-}C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl;

with the proviso that the following compounds are excluded:

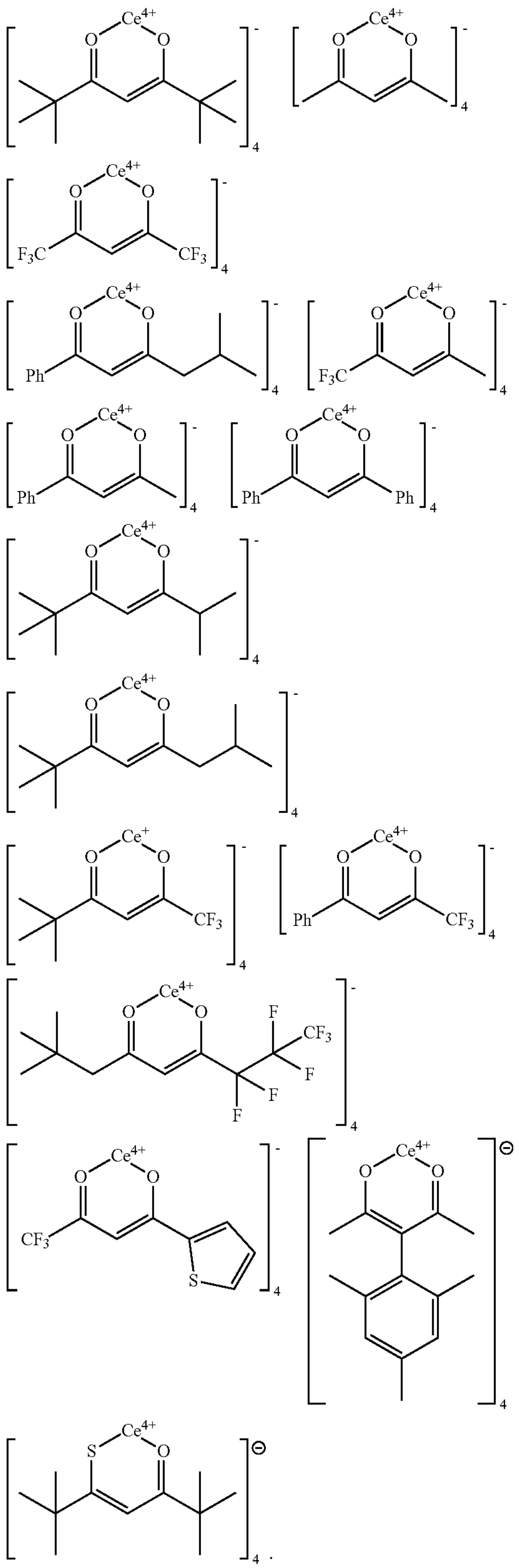

A further object of the invention are compounds of the general formula (I)

(I)

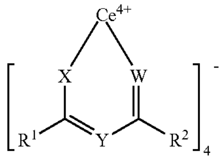

and their charge transfer complexes, their reduction products and mixtures thereof, wherein X and W independently from each other represent 0, S or $NR^6$;

Y represents N or $CR^3$;

$R^1$, $R^2$ independently from each other represent CN, $C_1$-$C_6$ alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl;

with the proviso that the following compounds are excluded:

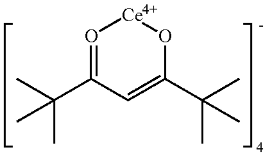

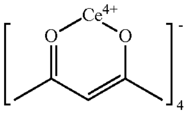

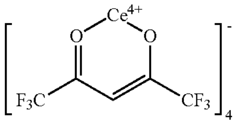

-continued

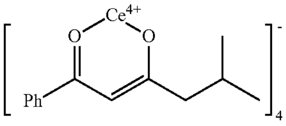

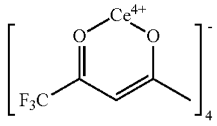

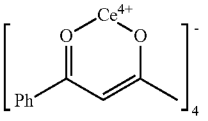

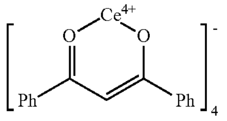

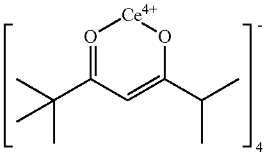

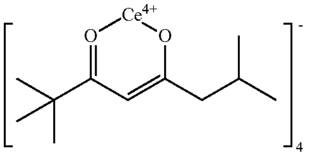

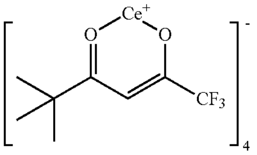

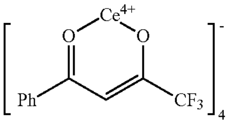

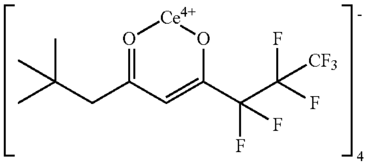

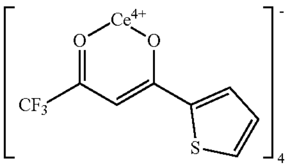

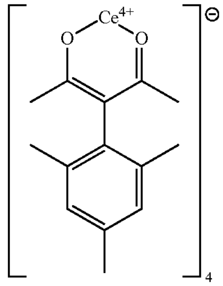

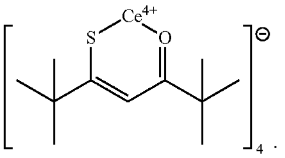

A further object of the invention are compounds of general formula (I)

(I)

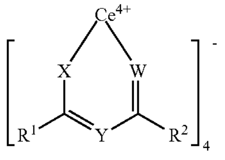

and their charge transfer complexes, their reduction products and mixtures thereof, wherein X and W independently from each other represent 0, S or $NR^6$;

Y represents N or $CR^3$;

$R^1$, $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

with the proviso that the following compounds are excluded:

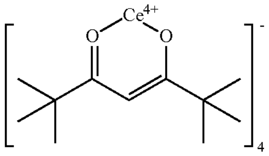

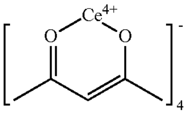

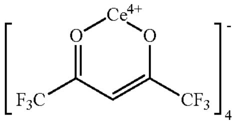

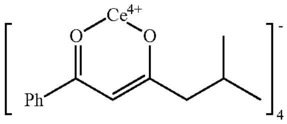

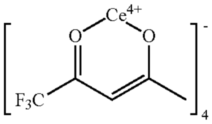

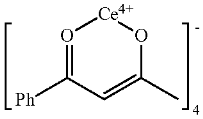

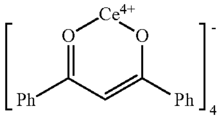

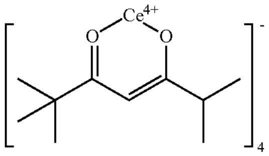

-continued

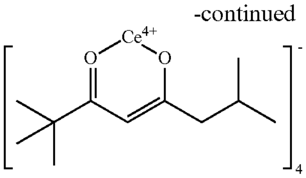

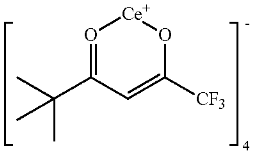

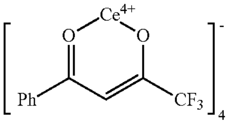

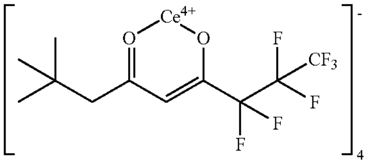

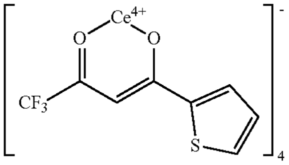

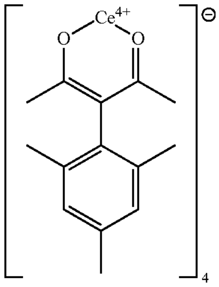

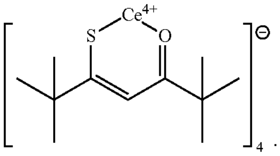

.

DESCRIPTION OF THE INVENTION

The invention has the following advantages:

The cerium-(IV)-complexes according to the invention have only low production costs.

The cerium-(IV)-complexes according to the invention are advantageously suitable as electron acceptors for use as p-dopants and as electron transport materials in organic-electronic components.

The cerium-(IV)-complexes according to the invention exhibit better conductivity compared to known electron acceptors.

The cerium-(IV)-complexes according to the invention show an improved thermostability of the doped layers compared to the state of the art.

Furthermore, the cerium (IV) complexes according to the invention are characterized by a higher doping efficiency.

The cerium-(IV)-complexes according to the invention show only a low absorption of the doped layer. Therefore, parasitic absorption and emissions can be reduced or even prevented.

The cerium-(IV)-complexes according to the invention are suitable for the production of organic and hybrid opto-electronic components, both by means of solvent processing and by vacuum reprocessing.

In the context of the invention, a bidentate ligand (also called didentate) is a ligand, which binds with two atoms to the metal atom (cerium atom).

In the context of the invention, a homoleptic cerium (IV) compound is a complex, wherein all ligands are identical.

In the context of the invention, a heteroleptic cerium (IV) compound is a complex, wherein the meaning of at least one ligand is different to the remaining ligands.

In the context of the invention, the prefix $C_n$-$C_m$ indicates the number of carbon atoms that a molecule or residue designated thereby may contain.

In the context of the invention, the expression $C_1$-$C_6$-alkyl refers to unbranched or branched saturated hydrocarbon groups having 1 to 6 carbon atoms. $C_1$-$C_6$-alkyl are e.g. methyl, ethyl, propyl, 1-methylethyl, butyl, 1-methylpropyl, 2-methyl propyl, 1,1-dimethylethyl, pentyl, 1-methylbutyl, 2-methylbutyl, 3-methylbutyl, 2,2-dimethylpropyl, 1-ethylpropyl, hexyl, 1,1-dimethylpropyl, 1,2-dimethylpropyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl or 1-ethyl-2-methylpropyl. $C_1$-$C_4$-alkyl refers, e.g. to methyl, ethyl, propyl, 1-methylethyl, butyl, 1-methylpropyl, 2-methylpropyl or 1,1-dimethylethyl.

In the context of the invention the expression $C_1$-$C_6$-alkoxy refers to an unbranched or branched saturated $C_1$-$C_6$-alkyl group as defined above, which is bound via an oxygen atom. Alkoxy radicals with 1 to 4 carbon atoms are preferred, particularly preferred are 1 or 2 carbon atoms. $C_1$-$C_2$-alkoxy is methoxy or ethoxy. $C_1$-$C_4$-alkoxy is e.g. methoxy, ethoxy, n-propoxy, 1-methylethoxy (isopropoxy), butoxy, 1-methylpropoxy (sec-butoxy), 2-methylpropoxy (isobutoxy) or 1,1-dimethylethoxy (tert-butoxy). $C_1$-$C_6$-alkoxy comprises the meanings given for $C_1$-$C_4$-alkoxy and additionally e.g. pentoxy, 1 methylbutoxy, 2-methylbutoxy, 3-methylbutoxy, 1,1-dimethylpropoxy, 1,2-dimethylpropoxy, 2,2-dimethylpropoxy, 1-ethylpropoxy, hexyloxy, 1-methylpentoxy, 2-methylpentoxy, 3-methylpentoxy, 4-methylpentoxy, 1,1-dimethylbutoxy, 1,2-dimethylbutoxy, 1,3-dimethylbutoxy, 2,2-dimethylbutoxy, 2,3-dimethylbutoxy and 3,3-dimethylbutoxy.

In the context of the invention the expression $C_1$-$C_6$-alkylsulfanyl refers to an unbranched or branched saturated $C_1$-$C_6$-alkyl group as defined above, which is bound via a sulfur atom. Alkylsulfanyl radicals with 1 to 4 carbon atoms are preferred, particularly preferred are 1 or 2 carbon atoms. $C_1$-$C_2$-alkylsulfanyl is methylsulfanyl or ethylsulfanyl. $C_1$-$C_4$-alkylsulfanyl is e.g. methylsulfanyl, ethylsulfanyl, n-propylsulfanyl, 1-methylethyl-sulfanyl (isopropylsulfanyl), butylsulfanyl, 1-methylpropylsulfonyl (sec-butylsulfanyl), 2-methylpropylsulfonyl (isobutylsulfanyl) or 1,1-dimethylethylsulfanyl (tert-butylsulfanyl). $C_1$-$C_6$-alkylthio comprises the meanings given for $C_1$-$C_4$-alkylsulfanyl and additionally also, e.g., pentylsulfanyl, 1-methylbutylsulfanyl, 2-methylbutylsulfanyl, 3-methylbutylsulfanyl, 1,1-dimethylpropylsulfanyl, 1,2-dimethylpropylsulfanyl, 2,2-dimethylpropylsulfanyl, 1-ethylpropylsulfanyl, hexylsulfanyl, 1-methylpentylsulfanyl, 2-methylpentylsulfanyl, 3-methylpentylsulfanyl, 4-methylpentylsulfanyl, 1,1-dimethylbutylsulfanyl, 1,2-dimethylbutylsulfanyl, 1,3-dimethylbutylsulfanyl, 2,2-dimethylbutylsulfanyl, 2,3-dimethylbutylsulfanyl, 3,3-dimethylbutylsulfanyl, 1-ethylbutylsulfanyl, 2-ethylbutylsulfanyl, 1,1,2-trimethylpropylsulfanyl, 1,2,2-trimethylpropylsulfanyl, 1-ethyl-1-methylpropylsulfanyl or 1-ethyl-2-methylpropylsulfanyl.

In the context of the invention the expressions haloalkyl, haloalkoxy and haloalkylsulfanyl refer to partially or fully halogenated alkyl, alkoxy or alkylsulfanyl. In other words, one or more hydrogen atoms, for example 1, 2, 3, 4 or 5 hydrogen atoms bonded to one or more carbon atoms of alkyl, alkoxy or alkylsulfanyl are replaced by a halogen atom, in particular by fluorine or chlorine.

The expression "halogen" denotes in each case fluorine, chlorine, bromine or iodine.

The expression "CN" denotes the cyano group (—C≡N).

The expression "aryl" comprises in the context of the invention mono- or polynuclear aromatic hydrocarbon radicals with usually 6 to 14, especially preferably 6 to 10 carbon atoms. Examples of aryl are especially phenyl, naphthyl, indenyl, fluorenyl, anthracenyl, phenanthrenyl, naphthacenyl, chrysenyl, pyrenyl, etc. and especially phenyl or naphthyl.

The expression "hetaryl" comprises in the context of the invention mono- or polynuclear aromatic hydrocarbon radicals with 4 to 13 carbon atoms, wherein 1, 2 or 3 carbon atoms have been replaced by 1, 2 or 3 identical or different heteroatoms or heteroatom-containing groups as ring members, said heteroatoms and heteroatom-containing groups, selected from N, $NR^7$, O, S, SO and $SO_2$. The hetaryl group may be attached to the remainder of the molecule via a ring carbon or via a ring nitrogen. Examples of 5- or 6-membered aromatic heterocyclic rings (also called heteroaromatic rings or hetaryl) are 2-furyl, 3-furyl, 2-thienyl, 3-thienyl, 2-pyrrolyl, 3-pyrrolyl, 3-pyrazolyl, 4-pyrazolyl, 5-pyrazolyl, 2-oxazolyl, 4-oxazolyl, 5-oxazolyl, 2-thiazolyl, 4-thiazolyl, 5-thiazolyl, 2-imidazolyl, 4-imidazolyl, 1,3,4-triazol-2-yl, 2-pyridinyl, 3-pyridinyl, 4-pyridinyl, 3-pyridazinyl, 4-pyridazinyl, 2-pyrimidinyl, 4-pyrimidinyl, 5-pyrimidinyl and 2-pyrazinyl. Examples of 8-, 9- or 10-membered aromatic heterobicyclic rings are hetaryl having one of the aforementioned 5- or 6-membered heteroaromatic rings and another aromatic carbocycle or 5- or 6-membered heterocycle fused thereto, for example a fused benzene, thiophen-, furan-, pyrrol-, pyrazol-, imidazol-, pyridin- or pyrimidin-ring. These bicyclic hetarylenes comprises e.g. quinolinyl, isoquinolinyl, cinnolinyl, indolyl, indolizinyl, isoindolyl, indazolyl, benzofuryl, in particular 2-benzofuryl, benzothienyl, in particular 2-benzothienyl, benzo[b]thiazolyl, in particular 2-benzo[b]thiazolyl, benzoxazolyl, in particular 2-benzoxazolyl, benzothiazolyl, in particular 2-benzothiazolyl, benzimidazolyl, in particular 2-benzimidazolyl, imidazo[1,2-a]pyridin-2-yl, thieno[3,2-b]pyridin-5yl, imidazo-[2,1-b]-thiazol-6-yl and 1,2,4-triazolo[1,5-a]pyridin-2-yl.

When # appears in a formula, showing a preferred substructure of a compound of the present invention, it denotes the bond to the rest of the molecule.

Cerium Compounds of the Formulae (I.1) and (I)

The compound of formula (I.1)

$$Ce^{4+}(L_1L_2L_3L_4)^{4-} \quad (I.1),$$

wherein $L_1$; $L_2$; $L_3$; and $L_4$ are defined above and below, encompasses compounds, wherein all four ligands $L_1$, $L_2$, $L_3$ and $L_4$ have the same meanings, three of the four ligands have the same meanings, two of the four ligands have the same meanings, all four ligands $L_1$, $L_2$, $L_3$ and $L_4$ have different meaning.

Preferred are compounds of formula (I.1) wherein $L_1$, $L_2$, $L_3$ and $L_4$ have the same meanings.

In the cerium compounds of formula (I.1) $L_1$, $L_2$, $L_3$ and $L_4$ are independently from each other selected from bidentate ligands having the general formula (I.2). In the following preferred embodiments of the compounds (I.1) are directly defined by preferred embodiments of their bidentate ligands (I.2).

Preferred are compounds of formula (I) and ligands of formula (I.2), wherein $R^1$ and $R^2$ are independently selected from CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$ and the group A consisting of A1, A2, A3, A4, A5, A6, A7, A8, A9, A10, A11, A12, A13, A14, A15, A16, A17 A18 and A19

A1

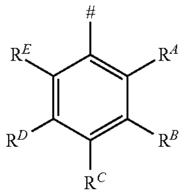

A2

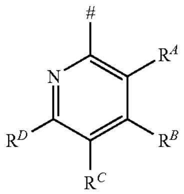

A3

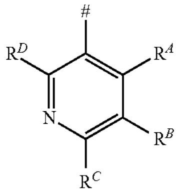

A4

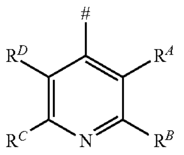

A5

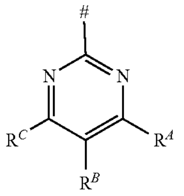

A6

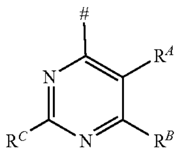

A7

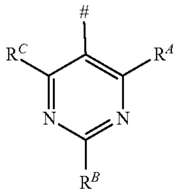

-continued

A8

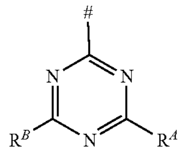

A9

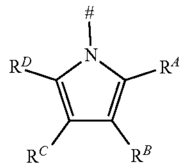

A10

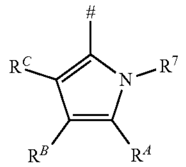

A11

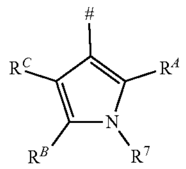

A12

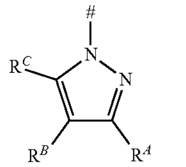

A13

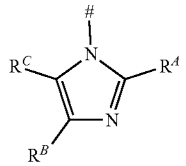

A14

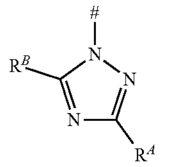

A15

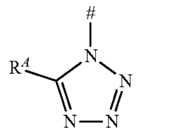

A16

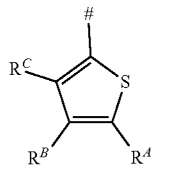

-continued

A17

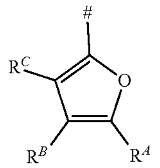

A18

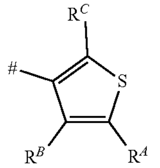

A19

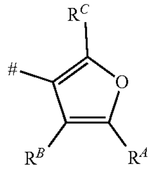

where # denotes the bond to the remaining molecule of formula (I) and ligands of formula (I.2), $R^A$, $R^B$, $R^c$, $R^D$ and $R^E$ are independently selected from hydrogen, CN, halogen, $C_1$-$C_4$-alkyl, $C_1$-$C_4$-haloalkyl and phenyl, which is unsubstituted or substituted by 1, 2 or 3 identical or different radicals selected from $C_1$-$C_4$-alkyl and $C_1$-$C_4$-haloalkyl;

$R^{4a}$, $R^{4b}$ independently represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl; and $R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$.

Another preferred embodiment are compounds of formula (I) and ligands of formula (I.2), wherein $R^1$ and $R^2$ are independently selected from CN, $C_1$-$C_6$ alkyl, $C_1$-$C_6$ haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$ and the group A consisting of A1, A2, A3, A4, A5, A6, A7, A8, A9, A10, A11, A12, A13, A14 and A15, where $R^A$, $R^B$, $R^C$, $R^D$ and $R^E$ are independently selected from hydrogen, CN, halogen, $C_1$-$C_4$-alkyl and $C_1$-$C_4$-haloalkyl;

$R^{4a}$, $R^{4b}$ independently represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl; and $R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$.

Irrespective of their occurrence the radicals $R^A$, $R^B$, $R^C$, $R^D$ and $R^E$ are preferably selected from hydrogen, CN, fluorine, chlorine, $C_1$-$C_4$-alkyl, $C_1$-$C_4$-fluoroalkyl, $C_1$-$C_4$-chloroalkyl and phenyl, which is unsubstituted or substituted by 1, 2 or 3 identical or different radicals selected from $C_1$-$C_4$-haloalkyl.

Particularly preferred, the radicals $R^A$, $R^B$, $R^C$, $R^D$ and $R^E$ are independently from each other selected from hydrogen, CN, fluorine and chlorine.

In another particular embodiment the radicals $R^A$, $R^B$, $R^C$, $R^D$ and $R^E$ are independently from each other selected from hydrogen, CN, fluorine, chlorine and phenyl, which is substituted by 1 or 2 identical or different radicals selected from $C_1$-$C_2$-haloalkyl.

Especially preferred, the radicals $R^A$, $R^B$, $R^C$, $R^D$ and $R^E$ all represent fluorine.

Also especially preferred the radicals $R^A$, $R^B$, $R^D$ and $R^E$ are hydrogen and $R^C$ is 3,5-di(trifluoromethyl)phenyl.

Preferably in formula (I) and ligands of formula (I.2), $R^1$ and $R^2$ are independently selected from $C_1$-$C_4$-alkyl, $C_1$-$C_4$-haloalkyl, A1 and A5

A1

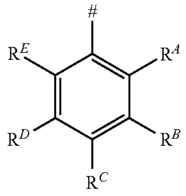

A5

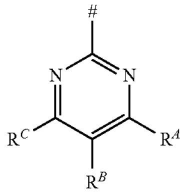

where # denotes the bond to the remaining molecule of formula (I) and ligands of formula (I.2), and wherein $R^A$, $R^B$, $R^C$, $R^D$ and $R^E$ are independently selected from hydrogen, CN, fluorine, chlorine, $C_1$-$C_4$-alkyl, $C_1$-$C_4$-fluoroalkyl, $C_1$-$C_4$-chloroalkyl and phenyl, which is unsubstituted or substituted by 1, 2 or 3 identical or different radicals selected from $C_1$-$C_4$-haloalkyl.

In another preferred embodiment in formula (I) and ligands of formula (I.2) $R^1$ and $R^2$ are independently selected from A16 and A17

A16

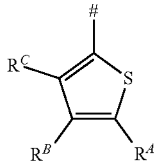

A17

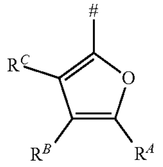

where # denotes the bond to the remaining molecule of formula (I) and ligands of formula (I.2), and wherein $R^A$, $R^B$ and $R^C$ are independently selected from hydrogen, CN, fluorine, chlorine, $C_1$-$C_4$-alkyl, $C_1$-$C_4$-fluoroalkyl and $C_1$-$C_4$-chloroalkyl. Preferably $R^A$, $R^B$ and $R^C$ are all hydrogen.

In a preferred embodiment, in formula (I) and ligands of formula (I.2), $R^1$ and $R^2$ are independently selected from A1 and A5

A1

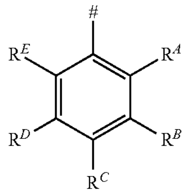

A5

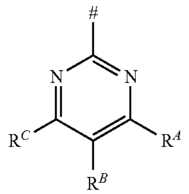

where # denotes the bond to the remaining molecule of formula (I) and ligands of formula (I.2), and wherein $R^A$, $R^B$, $R^C$, $R^D$ and $R^E$ are independently selected from hydrogen, CN, fluorine, chlorine, $C_1$-$C_4$ alkyl, $C_1$-$C_4$-fluoroalkyl, $C_1$-$C_4$-chloroalkyl and phenyl, which is unsubstituted or substituted by 1, 2 or 3 identical or different radicals selected from $C_1$-$C_4$-haloalkyl.

In a particularly preferred embodiment in formula (I) and ligands of formula (I.2) $R^1$ and $R^2$ are independently selected from A1 and A5, wherein $R^A$, $R^B$, $R^C$, $R^D$ and $R^E$ are independently selected from CN, fluorine and chlorine.

In another particularly preferred embodiment in formula (I) $R^1$ and $R^2$ are independently selected from A1 and A5, wherein $R^A$, $R^B$, $R^C$, $R^D$ and $R^E$ are independently selected from CN, fluorine and chlorine.

In another preferred embodiment in formula (I) and ligands of formula (I.2), $R^1$ and $R^2$ are independently selected from $C_1$-$C_4$-alkyl, $C_1$-$C_4$-fluoroalkyl, $C_1$-$C_4$-chloroalkyl and A1, wherein $R^A$, $R^B$, $R^C$, $R^D$ and $R^E$ are independently selected from CN, fluorine and chlorine.

In another preferred embodiment, in formula (I), $R^1$ and $R^2$ are independently selected from $C_1$-$C_4$-alkyl, $C_1$-$C_4$-fluoroalkyl, $C_1$-$C_4$-chloroalkyl and A1, wherein $R^A$, $R^B$, $R^c$, $R^D$ and $R^E$ are independently selected from CN, fluorine and chlorine.

In a particular embodiment, in formula (I) and ligands of formula (I.2), $R^1$ and $R^2$ are independently selected from A1 and A5, wherein $R^A$, $R^B$, $R^C$, $R^D$ and $R^E$ are fluorine.

In a particular embodiment, in formula (I), $R^1$ and $R^2$ are independently selected from A1 and A5, wherein $R^A$, $R^B$, $R^C$, $R^D$ and $R^E$ are fluorine.

In another preferred embodiment in formula (I) and ligands of formula (I.2), $R^1$ and $R^2$ are'A1, wherein $R^A$, $R^B$, $R^D$ and $R^E$ are hydrogen and $R^C$ is 3,5-di(trifluoromethyl) phenyl.

In another preferred embodiment, in formula (I), $R^1$ and $R^2$ are A1, wherein $R^A$, $R^B$, $R^D$ and $R^E$ are hydrogen and $R^C$ is 3,5-di(trifluoromethyl)phenyl.

Preferred are compounds of formula (I) and ligands of formula (I.2), wherein Y represents the radical $CR^3$ and $R^3$ is selected from hydrogen, CN, nitro, halogen, $CF_3$ and the group B consisting B1, B2, B3, B4, B5, B6, B7, B8, B9, B10, B11, B12, B13, B14 and B15

B1

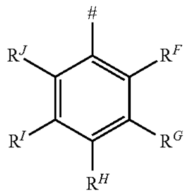

B2

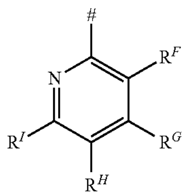

B3

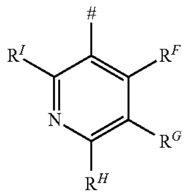

B4

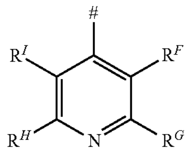

B5

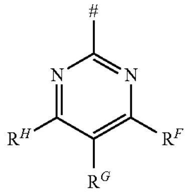

B6

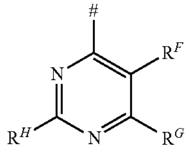

B7

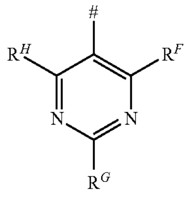

B8

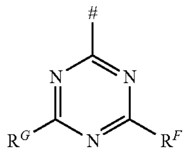

-continued

B9

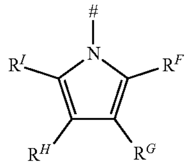

B10

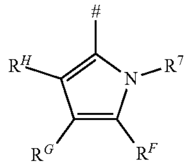

B11

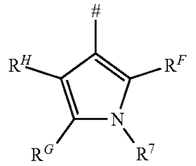

B12

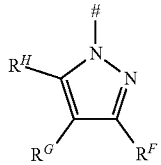

B13

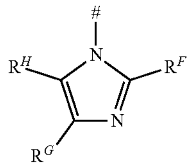

B14

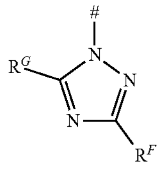

B15

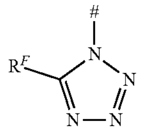

where # denotes the bond to the remaining molecule of formula (I) and ligands of formula (I.2), $R^F$, $R^G$, $R^H$, $R^I$ and $R^J$ are independently selected from hydrogen, CN, halogen, $C_1$-$C_4$-alkyl and $C_1$-$C_4$-haloalkyl; and $R^7$ represents hydrogen, $C_1$-$C_6$-alkyl, $C_1$-$C_6$-haloalkyl or $C_1$-$C_{14}$-aryl, wherein aryl is unsubstituted or substituted by 1, 2, 3, 4 or 5 identical or different radicals $R^5$.

Irrespective of their occurrence the radicals $R^F$, $R^G$, $R^H$, $R^I$ and $R^J$ are preferably selected from hydrogen, CN, fluorine, chlorine, $C_1$-$C_4$-alkyl, $C_1$-$C_4$-fluoroalkyl and $C_1$-$C_4$-chloroalkyl.

In a preferred embodiment the radicals $R^A$, $R^B$, $R^C$, $R^D$ and $R^E$ represent independently CN, fluorine or chlorine.

In formula (I) and ligands of formula (I.2), Y preferably represents a radical $CR^3$, wherein $R^3$ is selected from hydrogen, CN, nitro, halogen $CF_3$ and B1

B1

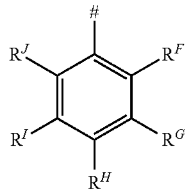

where # denotes the bond to the remaining molecule of formula (I) and ligands of formula (I.2), and wherein $R^F$, $R^G$, $R^H$, $R^I$ and $R^J$ are independently selected from hydrogen, CN, fluorine and chlorine.

In formula (I) and ligands of formula (I.2), Y preferably represents a radical $CR^3$, wherein $R^3$ represents B1

B1

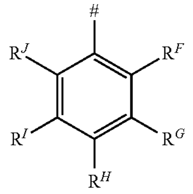

where # denotes the bond to the remaining molecule of formula (I) and ligands of formula (I.2), and wherein $R^F$, $R^G$, $R^H$, $R^I$ and $R^J$ are independently selected from CN, fluorine and chlorine.

In another preferred embodiment, Y represents a radical $CR^3$, wherein $R^3$ is selected from hydrogen, CN, nitro, fluorine, chlorine and $CF_3$.

Irrespective of their occurrence, the radicals $R^{4a}$ und $R^{4b}$ are preferably selected from hydrogen and $C_1$-$C_4$-alkyl.

Irrespective of its occurrence, the radical $R^5$ is preferably selected from CN, fluorine, chlorine, $C_1$-$C_4$-alkyl und $C_1$-$C_4$-haloalkyl.

Irrespective of its occurrence, the radical $R^6$ is preferably selected from hydrogen and $C_1$-$C_4$-alkyl.

Irrespective of its occurrence, the radical $R^7$ is preferably selected from hydrogen and $C_1$-$C_4$-alkyl and $C_1$-$C_4$-haloalkyl.

In a preferred first embodiment A, compounds of formula (I) and ligands of formula (I.2) are preferred, wherein X and W represent S or O, in particular O;

Y represents $CR^3$, wherein $R^3$ is selected from hydrogen, CN, nitro and halogen, in particular fluorine, CN and nitro;

$R^1$ and $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

Particular preferred are compounds of formula (I), wherein

X and W represent S or O, in particular O;

Y represents $CR^3$, wherein $R^3$ is selected from hydrogen, CN, nitro and halogen, in particular fluorine, CN and nitro;

$R^1$ and $R^2$ independently from each other represent CN, $C_1$-$C_6$ alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

In a preferred second embodiment B, compounds of formula (I) and ligands of formula (I.2) are preferred, wherein X and W represent S or O, in particular O;

Y represents $CR^3$, wherein $R^3$ represents B1, B2, B3, B4, B5, B6, B7, B8, B9, B10, B11, B12, B13, B14 or B15, in particular represents B1;

$R^1$ and $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represent $C_1$-$C_4$-alkyl or $C_1$-$C_4$-haloalkyl.

Particular preferred are compounds of formula (I), wherein

X and W represent S or O, in particular O;

Y represents $CR^3$, wherein $R^3$ represents B1, B2, B3, B4, B5, B6, B7, B8, B9, B10, B11, B12, B13, B14 or B15, in particular represents B1;

$R^1$ and $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represent $C_1$-$C_4$-alkyl or $C_1$-$C_4$-haloalkyl.

In a preferred third embodiment C, compounds of formula (I) and ligands of formula (I.2) are preferred, wherein X and W represent S or O, in particular O;

Y represents $CR^3$, wherein $R^3$ represents B1, B2, B3, B4, B5, B6, B7, B8, B9, B10, B11, B12, B13, B14 or B15, in particular represents B1;

$R^1$ and $R^2$ independently from each other represent A1, A2, A3, A4, A5, A6, A7, A8, A9, A10, A11, A12, A13, A14 or A15, in particular represent A1 or A5.

Particular preferred are compounds of formula (I), wherein

X and W represent S or O, in particular O;

Y represents $CR^3$, wherein $R^3$ represents B1, B2, B3, B4, B5, B6, B7, B8, B9, B10, B11, B12, B13, B14 or B15, in particular represents B1;

$R^1$ and $R^2$ independently from each other represent A1, A2, A3, A4, A5, A6, A7, A8, A9, A10, A11, A12, A13, A14 or A15, in particular represent A1 or A5.

In a preferred fourth embodiment D, compounds of formula (I) and ligands of formula (I.2) are preferred, wherein X and W represent S or O, in particular O;

Y represents $CR^3$, wherein $R^3$ is selected from hydrogen, CN, nitro and halogen, in particular fluorine, CN and nitro;

$R^1$ and $R^2$ independently from each other represent A1, A2, A3, A4, A5, A6, A7, A8, A9, A10, A11, A12, A13, A14 or A15, in particular represent A1 or A5.

Particular preferred are compounds of formula (I), wherein

X and W represent S or O, in particular O;

Y represents $CR^3$, wherein $R^3$ is selected from hydrogen, CN, nitro and halogen, in particular fluorine, CN and nitro;

$R^1$ and $R^2$ independently from each other represent A1, A2, A3, A4, A5, A6, A7, A8, A9, A10, A11, A12, A13, A14 or A15, in particular represent A1 or A5.

In a preferred fifth embodiment E, compounds of formula (I) and ligands of formula (I.2) are preferred, wherein X and W represent S or O, in particular O;

Y represents $CR^3$, wherein $R^3$ is selected from hydrogen, CN, nitro and halogen, in particular fluorine, CN and nitro;

$R^1$ represents A1;

$R^2$ represents CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

Particular preferred are compounds of formula (I), wherein

X and W represent S or O, in particular O;

Y represents $CR^3$, wherein $R^3$ is selected from hydrogen, CN, nitro and halogen, in particular fluorine, CN and nitro;

$R^1$ represents A1;

$R^2$ represents CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

In a preferred sixth embodiment F, compounds of formula (I) and ligands of formula (I.2) are preferred, wherein X and W represent S or O, in particular O;

Y represents $CR^3$, wherein $R^3$ is selected from hydrogen, CN, nitro and halogen, in hydrogen;

$R^1$ and $R^2$ independently from each other represent A16 or A17.

Particular preferred are compounds of formula (I), wherein

X and W represent S or O, in particular O;

Y represents $CR^3$, wherein $R^3$ is selected from hydrogen, CN, nitro and halogen, in hydrogen;

$R^1$ and $R^2$ independently from each other represent A16 or A17.

In a preferred seventh embodiment G, compounds of formula (I) and ligands of formula (I.2) are preferred, wherein X and W represent S or O, in particular O;

Y represents $CR^3$, wherein $R^3$ is selected from hydrogen, CN, nitro and halogen, in hydrogen;

$R^1$ represents A16 or A17;

$R^2$ represents CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

Particular preferred are compounds of formula (I), wherein

X and W represent S or O, in particular O;

Y represents $CR^3$, wherein $R^3$ is selected from hydrogen, CN, nitro and halogen, in hydrogen;

$R^1$ represents A16 or A17;

$R^2$ represents CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, in particular represents $C_1$-$C_4$-alkyl or $C_1$-$C_4$-haloalkyl.

Particular preferred are compounds of formula (I.a')

$Ce^{4+}[(R^1—C(—O)═C(R^3)—C(═O)—R^2)(R^{1'}—C(═O))═C(R^{3'})—C(═O)—R^{2'})(R^{1''}—C(—O)═C(R^{3''})—C(═O)—R^{2''})(R^{1'''}—C(—O)═C(R^{3'''})—C(═O)—R^{2'''})]^{4-}$ (I.a'), wherein ($R^1$, $R^2$, $R^3$), ($R^{1'}$, $R^{2'}$, $R^{3'}$), ($R^{1''}$, $R^{2''}$, $R^{3''}$) and ($R^{1'''}$, $R^{2'''}$, $R^{3'''}$) are each selected from the definition given in one line of the following table 1

TABLE 1

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 1. | methyl | methyl | H |
| 2. | methyl | methyl | CN |
| 3. | methyl | methyl | F |
| 4. | methyl | methyl | Cl |

TABLE 1-continued

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 5. | methyl | methyl | $NO_2$ |
| 6. | methyl | methyl | pentafluorophenyl |
| 7. | methyl | methyl | tetrafluoro-2-(trifluoromethyl)phenyl |
| 8. | methyl | methyl | tetrafluoro-3-(trifluoromethyl)phenyl |
| 9. | methyl | methyl | tetrafluoro-4-(trifluoromethyl)phenyl |
| 10. | methyl | methyl | tetrafluoro-2-pyridyl |
| 11. | methyl | methyl | tetrafluoro-3-pyridyl |
| 12. | methyl | methyl | tetrafluoro-4-pyridyl |
| 13. | methyl | methyl | tetrafluoro-2-benzonitrile |
| 14. | methyl | methyl | tetrafluoro-3-benzonitrile |
| 15. | methyl | methyl | tetrafluoro-4-benzonitrile |
| 16. | trifluoromethyl | trifluoromethyl | H |
| 17. | trifluoromethyl | trifluoromethyl | CN |
| 18. | trifluoromethyl | trifluoromethyl | F |
| 19. | trifluoromethyl | trifluoromethyl | Cl |
| 20. | trifluoromethyl | trifluoromethyl | $NO_2$ |
| 21. | trifluoromethyl | trifluoromethyl | pentafluorophenyl |
| 22. | trifluoromethyl | trifluoromethyl | tetrafluoro-2-(trifluoromethyl)phenyl |
| 23. | trifluoromethyl | trifluoromethyl | tetrafluoro-3-(trifluoromethyl)phenyl |
| 24. | trifluoromethyl | trifluoromethyl | tetrafluoro-4-(trifluoromethyl)phenyl |
| 25. | trifluoromethyl | trifluoromethyl | tetrafluoro-2-pyridyl |
| 26. | trifluoromethyl | trifluoromethyl | tetrafluoro-3-pyridyl |
| 27. | trifluoromethyl | trifluoromethyl | tetrafluoro-4-pyridyl |
| 28. | trifluoromethyl | trifluoromethyl | tetrafluoro-2-benzonitrile |
| 29. | trifluoromethyl | trifluoromethyl | tetrafluoro-3-benzonitrile |
| 30. | trifluoromethyl | trifluoromethyl | tetrafluoro-4-benzonitrile |
| 31. | pentafluoroethyl | pentafluoroethyl | H |
| 32. | pentafluoroethyl | pentafluoroethyl | CN |
| 33. | pentafluoroethyl | pentafluoroethyl | F |
| 34. | pentafluoroethyl | pentafluoroethyl | Cl |
| 35. | pentafluoroethyl | pentafluoroethyl | $NO_2$ |
| 36. | pentafluoroethyl | pentafluoroethyl | pentafluorophenyl |
| 37. | pentafluoroethyl | pentafluoroethyl | tetrafluoro-2-(trifluoromethyl)phenyl |
| 38. | pentafluoroethyl | pentafluoroethyl | tetrafluoro-3-(trifluoromethyl)phenyl |
| 39. | pentafluoroethyl | pentafluoroethyl | tetrafluoro-4-(trifluoromethyl)phenyl |
| 40. | pentafluoroethyl | pentafluoroethyl | tetrafluoro-2-pyridyl |
| 41. | pentafluoroethyl | pentafluoroethyl | tetrafluoro-3-pyridyl |
| 42. | pentafluoroethyl | pentafluoroethyl | tetrafluoro-4-pyridyl |
| 43. | pentafluoroethyl | pentafluoroethyl | tetrafluoro-2-benzonitrile |
| 44. | pentafluoroethyl | pentafluoroethyl | tetrafluoro-3-benzonitrile |
| 45. | pentafluoroethyl | pentafluoroethyl | tetrafluoro-4-benzonitrile |
| 46. | heptafluoro-n-propyl | heptafluoro-n-propyl | H |
| 47. | heptafluoro-n-propyl | heptafluoro-n-propyl | CN |
| 48. | heptafluoro-n-propyl | heptafluoro-n-propyl | F |
| 49. | heptafluoro-n-propyl | heptafluoro-n-propyl | Cl |
| 50. | heptafluoro-n-propyl | heptafluoro-n-propyl | $NO_2$ |
| 51. | heptafluoro-n-propyl | heptafluoro-n-propyl | pentafluorophenyl |
| 52. | heptafluoro-n-propyl | heptafluoro-n-propyl | tetrafluoro-2-(trifluoromethyl)phenyl |
| 53. | heptafluoro-n-propyl | heptafluoro-n-propyl | tetrafluoro-3-(trifluoromethyl)phenyl |
| 54. | heptafluoro-n-propyl | heptafluoro-n-propyl | tetrafluoro-4-(trifluoromethyl)phenyl |
| 55. | heptafluoro-n-propyl | heptafluoro-n-propyl | tetrafluoro-2-pyridyl |
| 56. | heptafluoro-n-propyl | heptafluoro-n-propyl | tetrafluoro-3-pyridyl |
| 57. | heptafluoro-n-propyl | heptafluoro-n-propyl | tetrafluoro-4-pyridyl |
| 58. | heptafluoro-n-propyl | heptafluoro-n-propyl | tetrafluoro-2-benzonitrile |
| 59. | heptafluoro-n-propyl | heptafluoro-n-propyl | tetrafluoro-3-benzonitrile |

TABLE 1-continued

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 60. | heptafluoro-n-propyl | heptafluoro-n-propyl | tetrafluoro-4-benzonitrile |
| 61. | heptafluoro-isopropyl | heptafluoro-isopropyl | H |
| 62. | heptafluoro-isopropyl | heptafluoro-isopropyl | CN |
| 63. | heptafluoro-isopropyl | heptafluoro-isopropyl | F |
| 64. | heptafluoro-isopropyl | heptafluoro-isopropyl | Cl |
| 65. | heptafluoro-isopropyl | heptafluoro-isopropyl | $NO_2$ |
| 66. | heptafluor-isopropyl | heptafluoro-isopropyl | pentafluorophenyl |
| 67. | heptafluor-isopropyl | heptafluoro-isopropyl | tetrafluoro-2-(trifluoromethyl)phenyl |
| 68. | heptafluoro-isopropyl | heptafluoro-isopropyl | tetrafluoro-3-(trifluoromethyl)phenyl |
| 69. | heptafluoro-isopropyl | heptafluoro-isopropyl | tetrafluoro-4-(trifluoromethyl)phenyl |
| 70. | heptafluoro-isopropyl | heptafluoro-isopropyl | tetrafluoro-2-pyridyl |
| 71. | heptafluoro-isopropyl | heptafluoro-isopropyl | tetrafluoro-3-pyridyl |
| 72. | heptafluoro-isopropyl | heptafluoro-isopropyl | tetrafluoro-4-pyridyl |
| 73. | heptafluoro-isopropyl | heptafluoro-isopropyl | tetrafluoro-2-benzonitrile |
| 74. | heptafluoro-isopropyl | heptafluoro-isopropyl | tetrafluoro-3-benzonitrile |
| 75. | heptafluoro-isopropyl | heptafluoro-isopropyl | tetrafluoro-4-benzonitrile |
| 76. | tert-butyl | tert-butyl | H |
| 77. | tert-butyl | tert-butyl | CN |
| 78. | tert-butyl | tert-butyl | F |
| 79. | tert-butyl | tert-butyl | Cl |
| 80. | tert-butyl | tert-butyl | $NO_2$ |
| 81. | tert-butyl | tert-butyl | pentafluorophenyl |
| 82. | tert-butyl | tert-butyl | tetrafluoro-2-(trifluoromethyl)phenyl |
| 83. | tert-butyl | tert-butyl | tetrafluoro-3-(trifluoromethyl)phenyl |
| 84. | tert-butyl | tert-butyl | tetrafluoro-4-(trifluoromethyl)phenyl |
| 85. | tert-butyl | tert-butyl | tetrafluoro-2-pyridyl |
| 86. | tert-butyl | tert-butyl | tetrafluoro-3-pyridyl |
| 87. | tert-butyl | tert-butyl | tetrafluoro-4-pyridyl |
| 88. | tert-butyl | tert-butyl | tetrafluoro-2-benzonitrile |
| 89. | tert-butyl | tert-butyl | tetrafluoro-3-benzonitrile |
| 90. | tert-butyl | tert-butyl | tetrafluoro-4-benzonitrile |
| 91. | nonafluoro-n-butyl | nonafluoro-n-butyl | H |
| 92. | nonafluoro-n-butyl | nonafluoro-n-butyl | CN |
| 93. | nonafluoro-n-butyl | nonafluoro-n-butyl | F |
| 94. | nonafluoro-n-butyl | nonafluoro-n-butyl | Cl |
| 95. | nonafluoro-n-butyl | nonafluoro-n-butyl | $NO_2$ |
| 96. | nonafluoro-n-butyl | nonafluoro-n-butyl | pentafluorophenyl |
| 97. | nonafluoro-n-butyl | nonafluoro-n-butyl | tetrafluoro-2-(trifluoromethyl)phenyl |
| 98. | nonafluoro-n-butyl | nonafluoro-n-butyl | tetrafluoro-3-(trifluoromethyl)phenyl |
| 99. | nonafluoro-n-butyl | nonafluoro-n-butyl | tetrafluoro-4-(trifluoromethyl)phenyl |
| 100. | nonafluoro-n-butyl | nonafluoro-n-butyl | tetrafluoro-2-pyridyl |
| 101. | nonafluoro-n-butyl | nonafluoro-n-butyl | tetrafluoro-3-pyridyl |
| 102. | nonafluoro-n-butyl | nonafluoro-n-butyl | tetrafluoro-4-pyridyl |
| 103. | nonafluoro-n-butyl | nonafluoro-n-butyl | tetrafluoro-2-benzonitrile |
| 104. | nonafluoro-n-butyl | nonafluoro-n-butyl | tetrafluoro-3-benzonitrile |

TABLE 1-continued

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 105. | nonafluoro-n-butyl | nonafluoro-n-butyl | tetrafluoro-4-benzonitrile |
| 106. | pentafluorophenyl | pentafluorophenyl | H |
| 107. | pentafluorophenyl | pentafluorophenyl | CN |
| 108. | pentafluorophenyl | pentafluorophenyl | F |
| 109. | pentafluorophenyl | pentafluorophenyl | Cl |
| 110. | pentafluorophenyl | pentafluorophenyl | $NO_2$ |
| 111. | pentafluorophenyl | pentafluorophenyl | pentafluorophenyl |
| 112. | pentafluorophenyl | pentafluorophenyl | tetrafluoro-2-(trifluoromethyl)phenyl |
| 113. | pentafluorophenyl | pentafluorophenyl | tetrafluoro-3-(trifluoromethyl)phenyl |
| 114. | pentafluorophenyl | pentafluorophenyl | tetrafluoro-4-(trifluoromethyl)phenyl |
| 115. | pentafluorophenyl | pentafluorophenyl | tetrafluoro-2-pyridyl |
| 116. | pentafluorophenyl | pentafluorophenyl | tetrafluoro-3-pyridyl |
| 117. | pentafluorophenyl | pentafluorophenyl | tetrafluoro-4-pyridyl |
| 118. | pentafluorophenyl | pentafluorophenyl | tetrafluoro-2-benzonitrile |
| 119. | pentafluorophenyl | pentafluorophenyl | tetrafluoro-3-benzonitrile |
| 120. | pentafluorophenyl | pentafluorophenyl | tetrafluoro-4-benzonitrile |
| 121. | 4-pyrimidyl | 4-pyrimidyl | H |
| 122. | 4-pyrimidyl | 4-pyrimidyl | CN |
| 123. | 4-pyrimidyl | 4-pyrimidyl | F |
| 124. | 4-pyrimidyl | 4-pyrimidyl | Cl |
| 125. | 4-pyrimidyl | 4-pyrimidyl | $NO_2$ |
| 126. | 4-pyrimidyl | 4-pyrimidyl | pentafluorophenyl |
| 127. | 4-pyrimidyl | 4-pyrimidyl | tetrafluoro-2-(trifluoromethyl)phenyl |
| 128. | 4-pyrimidyl | 4-pyrimidyl | tetrafluoro-3-(trifluoromethyl)phenyl |
| 129. | 4-pyrimidyl | 4-pyrimidyl | tetrafluoro-4-(trifluoromethyl)phenyl |
| 130. | 4-pyrimidyl | 4-pyrimidyl | tetrafluoro-2-pyridyl |
| 131. | 4-pyrimidyl | 4-pyrimidyl | tetrafluoro-3-pyridyl |
| 132. | 4-pyrimidyl | 4-pyrimidyl | tetrafluoro-4-pyridyl |
| 133. | 4-pyrimidyl | 4-pyrimidyl | tetrafluoro-2-benzonitrile |
| 134. | 4-pyrimidyl | 4-pyrimidyl | tetrafluoro-3-benzonitrile |
| 135. | 4-pyrimidyl | 4-pyrimidyl | tetrafluoro-4-benzonitrile |
| 136. | 2-pyrimidyl | 2-pyrimidyl | H |
| 137. | 2-pyrimidyl | 2-pyrimidyl | CN |
| 138. | 2-pyrimidyl | 2-pyrimidyl | F |
| 139. | 2-pyrimidyl | 2-pyrimidyl | Cl |
| 140. | 2-pyrimidyl | 2-pyrimidyl | $NO_2$ |
| 141. | 2-pyrimidyl | 2-pyrimidyl | pentafluorophenyl |
| 142. | 2-pyrimidyl | 2-pyrimidyl | tetrafluoro-2-(trifluoromethyl)phenyl |
| 143. | 2-pyrimidyl | 2-pyrimidyl | tetrafluoro-3-(trifluoromethyl)phenyl |
| 144. | 2-pyrimidyl | 2-pyrimidyl | tetrafluoro-4-(trifluoromethyl)phenyl |
| 145. | 2-pyrimidyl | 2-pyrimidyl | tetrafluoro-2-pyridyl |
| 146. | 2-pyrimidyl | 2-pyrimidyl | tetrafluoro-3-pyridyl |
| 147. | 2-pyrimidyl | 2-pyrimidyl | tetrafluoro-4-pyridyl |
| 148. | 2-pyrimidyl | 2-pyrimidyl | tetrafluoro-2-benzonitrile |
| 149. | 2-pyrimidyl | 2-pyrimidyl | tetrafluoro-3-benzonitrile |
| 150. | 2-pyrimidyl | 2-pyrimidyl | tetrafluoro-4-benzonitrile |
| 151. | 3,5-bis(trifluoro-methyl)-phenyl | 3,5-bis(trifluoro-methyl)-phenyl | H |
| 152. | 3,5-bis(trifuoro-methyl)-phenyl | trifluoromethyl | H |
| 153. | phenyl | pentafluoroethyl | H |
| 154. | furan-2-yl | trifluoromethyl | H |
| 155. | furan-2-yl | pentafluoroethyl | H |
| 156. | 3,5-bis(trifluoro-methyl)-phenyl | pentafluoroethyl | H |
| 157. | 3',5'-bis(trifluoro-methyl)-[1,1'-biphenyl]-4-yl | pentafluoroethyl | H |
| 158. | 3',5'-bis(trifluoro-methyl)-[1,1'-biphenyl]-4-yl | trifluoromethyl | H |
| 159. | 4-fluoro-3-trifluoromethyl-phenyl | pentafluoroethyl | H |
| 160. | 4-fluoro-3-trifluoromethyl-phenyl | 3,5-bis(trifluoro-methyl)-phenyl | H |

TABLE 1-continued

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 161. | 3,4,5-trifluoro-phenyl | 3,4,5-trifluoro-phenyl | H |
| 162. | 3,4,5-trifluoro-phenyl | pentafluoroethyl | H |
| 163. | 4-(trifluoro-methyl)phenyl | 4-(trifluoro-methyl)phenyl | H |
| 164. | 4-(trifluoro-methyl)phenyl | pentafluoroethyl | H |
| 165. | 2,4,6-tris(trifluoro-methyl)phenyl | 2,4,6-tris(trifluoro-methyl)phenyl | H |
| 166. | 2,4,6-tris(trifluoro-methyl)phenyl | Pentafluoroethyl | H |
| 167. | 3,5-bis(trifluoro-methyl)-phenyl | 3,5-bis(trifluoro-methyl)-phenyl | CN |
| 168. | 2,4,6-tris(trifluoro-methyl)phenyl | 2,4,6-tris(trifluoro-methyl)phenyl | CN |
| 169. | 3,5-bis(trifluoro-methyl)-phenyl | pentafluoroethyl | 3,5-bis(trifluoromethyl)-phenyl |
| 170. | 3,4-bis(trifluoro-methyl)-phenyl | 3,4-bis(trifluoro-methyl)-phenyl | H |
| 171. | 3,4-bis(trifluoro-methyl)-phenyl | trifluoromethyl | H |
| 172. | 3,4-bis(trifluoro-methyl)-phenyl | pentafluoroethyl | 3,5-bis(trifluoromethyl)-phenyl |
| 173. | 3,4-bis(trifluoro-methyl)-phenyl | pentafluoroethyl | H |
| 174. | 3,4-bis(trifluoro-methyl)-phenyl | 3,4-bis(trifluoro-methyl)-phenyl | CN |
| 175. | 4-cyano-3-(tri-fluoromethyl)-phenyl | 3,5-bis(trifluoro-methyl)-phenyl | H |
| 176. | 4-cyano-3-(tri-fluoromethyl)-phenyl | pentafluoroethyl | H |
| 177. | 3,5-bis(trifluoro-methyl)-phenyl | pentafluoroethyl | CN |
| 178. | 4-cyano-2,6-bis(trifluoro-methyl)-phenyl | 4-cyano-2,6-bis(trifluoro-methyl)-phenyl | H |
| 179. | 4-cyano-2,6-bis(trifluoro-methyl)-phenyl | pentafluoroethyl | H |
| 180. | 2,4-bis(trifluoro-methyl)-phenyl | 2,6-bis(trifluoro-methyl)-phenyl | H |
| 181. | 2,4-bis(trifluoro-methyl)-phenyl | 2,6-bis(trifluoro-methyl)-phenyl | CN |
| 182. | 4-(3',5'-bis(trifluoromethyl)phenyl)-2,6-bis(trifluoro-methyl)-phenyl | pentafluoroethyl | H |
| 183. | phenyl | phenyl | CN |
| 184. | 3,5-bis(trifluoro-methyl)-phenyl | 3,5-bis(trifluoro-methyl)-phenyl | $CF_3$ |
| 185. | 3,5-bis(trifluoro-methyl)-phenyl | trifluoromethyl | CF3 |
| 186. | phenyl | pentafluoroethyl | $CF_3$ |
| 187. | 3,5-bis(trifluoro-methyl)-phenyl | pentafluoroethyl | $CF_3$ |
| 188. | 3,4,5-trifluoro-phenyl | 3,4,5-trifluoro-phenyl | $CF_3$ |

TABLE 1-continued

| | $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|---|
| 189. | 4-(trifluoro-methyl)phenyl | 4-(trifluoro-methyl)phenyl | $CF_3$ |
| 190. | phenyl | phenyl | $CF_3$ |

Particularly preferred are the compounds of formula (I.a)

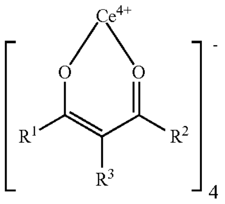

(I.a)

wherein $R^1$, $R^2$ and $R^3$ are as defined in table 2:

TABLE 2

| | $R^1$ | $R^2$ | $R^3$ |
|---|---|---|---|
| 1. | methyl | methyl | H |
| 2. | methyl | methyl | CN |
| 3. | methyl | methyl | F |
| 4. | methyl | methyl | Cl |
| 5. | methyl | methyl | $NO_2$ |
| 6. | methyl | methyl | pentafluorophenyl |
| 7. | methyl | methyl | tetrafluoro-2-(trifluoromethyl)phenyl |
| 8. | methyl | methyl | tetrafluoro-3-(trifluoromethyl)phenyl |
| 9. | methyl | methyl | tetrafluoro-4-(trifluoromethyl)phenyl |
| 10. | methyl | methyl | tetrafluoro-2-pyridyl |
| 11. | methyl | methyl | tetrafluoro-3-pyridyl |
| 12. | methyl | methyl | tetrafluoro-4-pyridyl |
| 13. | methyl | methyl | tetrafluoro-2-benzonitrile |
| 14. | methyl | methyl | tetrafluoro-3-benzonitrile |
| 15. | methyl | methyl | tetrafluoro-4-benzonitrile |
| 16. | trifluoromethyl | trifluoromethyl | H |
| 17. | trifluoromethyl | trifluoromethyl | CN |
| 18. | trifluoromethyl | trifluoromethyl | F |
| 19. | trifluoromethyl | trifluoromethyl | Cl |
| 20. | trifluoromethyl | trifluoromethyl | $NO_2$ |
| 21. | trifluoromethyl | trifluoromethyl | pentafluorophenyl |
| 22. | trifluoromethyl | trifluoromethyl | tetrafluoro-2-(trifluoromethyl)phenyl |
| 23. | trifluoromethyl | trifluoromethyl | tetrafluoro-3-(trifluoromethyl)phenyl |
| 24. | trifluoromethyl | trifluoromethyl | tetrafluoro-4-(trifluoromethyl)phenyl |
| 25. | trifluoromethyl | trifluoromethyl | tetrafluoro-2-pyridyl |
| 26. | trifluoromethyl | trifluoromethyl | tetrafluoro-3-pyridyl |
| 27. | trifluoromethyl | trifluoromethyl | tetrafluoro-4-pyridyl |
| 28. | trifluoromethyl | trifluoromethyl | tetrafluoro-2-benzonitrile |
| 29. | trifluoromethyl | trifluoromethyl | tetrafluoro-3-benzonitrile |
| 30. | trifluoromethyl | trifluoromethyl | tetrafluoro-4-benzonitrile |
| 31. | pentafluoroethyl | pentafluoroethyl | H |
| 32. | pentafluoroethyl | pentafluoroethyl | CN |
| 33. | pentafluoroethyl | pentafluoroethyl | F |
| 34. | pentafluoroethyl | pentafluoroethyl | Cl |
| 35. | pentafluoroethyl | pentafluoroethyl | $NO_2$ |
| 36. | pentafluoroethyl | pentafluoroethyl | pentafluorophenyl |
| 37. | pentafluoroethyl | pentafluoroethyl | tetrafluoro-2-(trifluoromethyl)phenyl |
| 38. | pentafluoroethyl | pentafluoroethyl | tetrafluoro-3-(trifluoromethyl)phenyl |
| 39. | pentafluoroethyl | pentafluoroethyl | tetrafluoro-4-(trifluoromethyl)phenyl |
| 40. | pentafluoroethyl | pentafluoroethyl | tetrafluoro-2-pyridyl |
| 41. | pentafluoroethyl | pentafluoroethyl | tetrafluoro-3-pyridyl |

TABLE 2-continued

| | $R^1$ | $R^2$ | $R^3$ |
|---|---|---|---|
| 42. | pentafluoroethyl | pentafluoroethyl | tetrafluoro-4-pyridyl |
| 43. | pentafluoroethyl | pentafluoroethyl | tetrafluoro-2-benzonitrile |
| 44. | pentafluoroethyl | pentafluoroethyl | tetrafluoro-3-benzonitrile |
| 45. | pentafluoroethyl | pentafluoroethyl | tetrafluoro-4-benzonitrile |
| 46. | heptafluoro-n-propyl | heptafluoro-n-propyl | H |
| 47. | heptafluoro-n-propyl | heptafluoro-n-propyl | CN |
| 48. | heptafluoro-n-propyl | heptafluoro-n-propyl | F |
| 49. | heptafluoro-n-propyl | heptafluoro-n-propyl | Cl |
| 50. | heptafluoro-n-propyl | heptafluoro-n-propyl | $NO_2$ |
| 51. | heptafluoro-n-propyl | heptafluoro-n-propyl | pentafluorophenyl |
| 52. | heptafluoro-n-propyl | heptafluoro-n-propyl | tetrafluoro-2-(trifluoromethyl)phenyl |
| 53. | heptafluoro-n-propyl | heptafluoro-n-propyl | tetrafluoro-3-(trifluoromethyl)phenyl |
| 54. | heptafluoro-n-propyl | heptafluoro-n-propyl | tetrafluoro-4-(trifluoromethyl)phenyl |
| 55. | heptafluoro-n-propyl | heptafluoro-n-propyl | tetrafluoro-2-pyridyl |
| 56. | heptafluoro-n-propyl | heptafluoro-n-propyl | tetrafluoro-3-pyridyl |
| 57. | heptafluoro-n-propyl | heptafluoro-n-propyl | tetrafluoro-4-pyridyl |
| 58. | heptafluoro-n-propyl | heptafluoro-n-propyl | tetrafluoro-2-benzonitrile |
| 59. | heptafluoro-n-propyl | heptafluoro-n-propyl | tetrafluoro-3-benzonitrile |
| 60. | heptafluoro-n-propyl | heptafluoro-n-propyl | tetrafluoro-4-benzonitrile |
| 61. | heptafluoro-isopropyl | heptafluoro-isopropyl | H |
| 62. | heptafluoro-isopropyl | heptafluoro-isopropyl | CN |
| 63. | heptafluoro-isopropyl | heptafluoro-isopropyl | F |
| 64. | heptafluoro-isopropyl | heptafluoro-isopropyl | Cl |
| 65. | heptafluoro-isopropyl | heptafluoro-isopropyl | $NO_2$ |
| 66. | heptafluoro-isopropyl | heptafluoro-isopropyl | pentafluorophenyl |
| 67. | heptafluoro-isopropyl | heptafluoro-isopropyl | tetrafluoro-2-(trifluoromethyl)phenyl |
| 68. | heptafluoro-isopropyl | heptafluoro-isopropyl | tetrafluoro-3-(trifluoromethyl)phenyl |
| 69. | heptafluoro-isopropyl | heptafluoro-isopropyl | tetrafluoro-4-(trifluormethyl)phenyl |
| 70. | heptafluoro-isopropyl | heptafluoro-isopropyl | tetrafluoro-2-pyridyl |
| 71. | heptafluoro-isopropyl | heptafluoro-isopropyl | tetrafluoro-3-pyridyl |
| 72. | heptafluoro-isopropyl | heptafluoro-isopropyl | tetrafluoro-4-pyridyl |
| 73. | heptafluoro-isopropyl | heptafluoro-isopropyl | tetrafluoro-2-benzonitrile |
| 74. | heptafluoro-isopropyl | heptafluoro-isopropyl | tetrafluoro-3-benzonitrile |
| 75. | heptafluoro-isopropyl | heptafluoro-isopropyl | tetrafluoro-4-benzonitrile |
| 76. | tert-butyl | tert-butyl | H |
| 77. | tert-butyl | tert-butyl | CN |
| 78. | tert-butyl | tert-butyl | F |
| 79. | tert-butyl | tert-butyl | Cl |
| 80. | tert-butyl | tert-butyl | $NO_2$ |
| 81. | tert-butyl | tert-butyl | pentafluorophenyl |
| 82. | tert-butyl | tert-butyl | tetrafluoro-2-(trifluoromethyl)phenyl |
| 83. | tert-butyl | tert-butyl | tetrafluoro-3-(trifluoromethyl)phenyl |
| 84. | tert-butyl | tert-butyl | tetrafluoro-4-(trifluoromethyl)phenyl |
| 85. | tert-butyl | tert-butyl | tetrafluoro-2-pyridyl |
| 86. | tert-butyl | tert-butyl | tetrafluoro-3-pyridyl |

TABLE 2-continued

| | $R^1$ | $R^2$ | $R^3$ |
|---|---|---|---|
| 87. | tert-butyl | tert-butyl | tetrafluoro-4-pyridyl |
| 88. | tert-butyl | tert-butyl | tetrafluoro-2-benzonitrile |
| 89. | tert-butyl | tert-butyl | tetrafluoro-3-benzonitrile |
| 90. | tert-butyl | tert-butyl | tetrafluoro-4-benzonitrile |
| 91. | nonafluoro-n-butyl | nonafluoro-n-butyl | H |
| 92. | nonafluoro-n-butyl | nonafluoro-n-butyl | CN |
| 93. | nonafluoro-n-butyl | nonafluoro-n-butyl | F |
| 94. | nonafluoro-n-butyl | nonafluoro-n-butyl | Cl |
| 95. | nonafluoro-n-butyl | nonafluoro-n-butyl | $NO_2$ |
| 96. | nonafluoro-n-butyl | nonafluoro-n-butyl | pentafluorophenyl |
| 97. | nonafluoro-n-butyl | nonafluoro-n-butyl | tetrafluoro-2-(trifluoromethyl)phenyl |
| 98. | nonafluoro-n-butyl | nonafluoro-n-butyl | tetrafluoro-3-(trifluormethyl)phenyl |
| 99. | nonafluoro-n-butyl | nonafluoro-n-butyl | tetrafluoro-4-(trifluoromethyl)phenyl |
| 100. | nonafluoro-n-butyl | nonafluoro-n-butyl | tetrafluoro-2-pyridyl |
| 101. | nonafluoro-n-butyl | nonafluoro-n-butyl | tetrafluoro-3-pyridyl |
| 102. | nonafluoro-n-butyl | nonafluoro-n-butyl | tetrafluoro-4-pyridyl |
| 103. | nonafluoro-n-butyl | nonafluoro-n-butyl | tetrafluoro-2-benzonitrile |
| 104. | nonafluoro-n-butyl | nonafluoro-n-butyl | tetrafluoro-3-benzonitrile |
| 105. | nonafluoro-n-butyl | nonafluoro-n-butyl | tetrafluoro-4-benzonitrile |
| 106. | pentafluorophenyl | pentafluorophenyl | H |
| 107. | pentafluorophenyl | pentafluorophenyl | CN |
| 108. | pentafluorophenyl | pentafluorophenyl | F |
| 109. | pentafluorophenyl | pentafluorophenyl | Cl |
| 110. | pentafluorophenyl | pentafluorophenyl | $NO_2$ |
| 111. | pentafluorophenyl | pentafluorophenyl | pentafluorophenyl |
| 112. | pentafluorophenyl | pentafluorophenyl | tetrafluoro-2-(trifluoromethyl)phenyl |
| 113. | pentafluorophenyl | pentafluorophenyl | tetrafluoro-3-(trifluoromethyl)phenyl |
| 114. | pentafluorophenyl | pentafluorophenyl | tetrafluoro-4-(trifluoromethyl)phenyl |
| 115. | pentafluorophenyl | pentafluorophenyl | tetrafluoro-2-pyridyl |
| 116. | pentafluorophenyl | pentafluorophenyl | tetrafluoro-3-pyridyl |
| 117. | pentafluorophenyl | pentafluorophenyl | tetrafluoro-4-pyridyl |
| 118. | pentafluorophenyl | pentafluorophenyl | tetrafluoro-2-benzonitrile |
| 119. | pentafluorophenyl | pentafluorophenyl | tetrafluoro-3-benzonitrile |
| 120. | pentafluorophenyl | pentafluorophenyl | tetrafluoro-4-benzonitrile |
| 121. | 4-pyrimidyl | 4-pyrimidyl | H |
| 122. | 4-pyrimidyl | 4-pyrimidyl | CN |
| 123. | 4-pyrimidyl | 4-pyrimidyl | F |
| 124. | 4-pyrimidyl | 4-pyrimidyl | Cl |
| 125. | 4-pyrimidyl | 4-pyrimidyl | $NO_2$ |
| 126. | 4-pyrimidyl | 4-pyrimidyl | pentafluorophenyl |
| 127. | 4-pyrimidyl | 4-pyrimidyl | tetrafluoro-2-(trifluoromethyl)phenyl |
| 128. | 4-pyrimidyl | 4-pyrimidyl | tetrafluoro-3-(trifluoromethyl)phenyl |
| 129. | 4-pyrimidyl | 4-pyrimidyl | tetrafluoro-4-(trifluoromethyl)phenyl |
| 130. | 4-pyrimidyl | 4-pyrimidyl | tetrafluoro-2-pyridyl |
| 131. | 4-pyrimidyl | 4-pyrimidyl | tetrafluoro-3-pyridyl |
| 132. | 4-pyrimidyl | 4-pyrimidyl | tetrafluoro-4-pyridyl |
| 133. | 4-pyrimidyl | 4-pyrimidyl | tetrafluoro-2-benzonitrile |
| 134. | 4-pyrimidyl | 4-pyrimidyl | tetrafluoro-3-benzonitrile |
| 135. | 4-pyrimidyl | 4-pyrimidyl | tetrafluoro-4-benzonitrile |
| 136. | 2-pyrimidyl | 2-pyrimidyl | H |
| 137. | 2-pyrimidyl | 2-pyrimidyl | CN |
| 138. | 2-pyrimidyl | 2-pyrimidyl | F |
| 139. | 2-pyrimidyl | 2-pyrimidyl | Cl |
| 140. | 2-pyrimidyl | 2-pyrimidyl | $NO_2$ |
| 141. | 2-pyrimidyl | 2-pyrimidyl | pentafluorophenyl |
| 142. | 2-pyrimidyl | 2-pyrimidyl | tetrafluoro-2-(trifluoromethyl)phenyl |
| 143. | 2-pyrimidyl | 2-pyrimidyl | tetrafluoro-3-(trifluoromethyl)phenyl |
| 144. | 2-pyrimidyl | 2-pyrimidyl | tetrafluoro-4-(trifluoromethyl)phenyl |
| 145. | 2-pyrimidyl | 2-pyrimidyl | tetrafluoro-2-pyridyl |
| 146. | 2-pyrimidyl | 2-pyrimidyl | tetrafluoro-3-pyridyl |
| 147. | 2-pyrimidyl | 2-pyrimidyl | tetrafluoro-4-pyridyl |
| 148. | 2-pyrimidyl | 2-pyrimidyl | tetrafluoro-2-benzonitrile |
| 149. | 2-pyrimidyl | 2-pyrimidyl | tetrafluoro-3-benzonitrile |
| 150. | 2-pyrimidyl | 2-pyrimidyl | tetrafluoro-4-benzonitrile |
| 151. | 3,5-bis(trifluoromethyl)-phenyl | 3,5-bis(trifluoromethyl)-phenyl | H |
| 152. | 3,5-bis(trifluoromethyl)-phenyl | trifluoromethyl | H |
| 153. | phenyl | pentafluoroethyl | H |
| 154. | furan-2-yl | trifluoromethyl | H |
| 155. | furan-2-yl | pentafluoroethyl | H |
| 156. | 3,5-bis(trifluoromethyl)-phenyl | pentafluoroethyl | H |
| 157. | 3',5'-bis(trifluoromethyl)-[1,1'-biphenyl]-4-yl | pentafluoroethyl | H |
| 158. | 3',5'-bis(trifluoromethyl)-[1,1'-biphenyl]-4-yl | trifluoromethyl | H |
| 159. | 4-fluoro-3-trifluoromethyl-phenyl | pentafluoroethyl | H |
| 160. | 4-fluoro-3-trifluoromethyl-phenyl | 3,5-bis(trifluoromethyl)-phenyl | H |
| 161. | 3,4,5-trifluorophenyl | 3,4,5-trifluorophenyl | H |
| 162. | 3,4,5-trifluorophenyl | pentafluoroethyl | H |
| 163. | 4-(trifluoromethyl)phenyl | 4-(trifluoromethyl)phenyl | H |
| 164. | 4-(trifluoromethyl)phenyl | pentafluoroethyl | H |
| 165. | 2,4,6-tris(trifluoromethyl)phenyl | 2,4,6-tris(trifluoromethyl)phenyl | H |
| 166. | 2,4,6-tris(trifluoromethyl)phenyl | Pentafluoroethyl | H |
| 167. | 3,5-bis(trifluoromethyl)-phenyl | 3,5-bis(trifluoromethyl)-phenyl | CN |
| 168. | 2,4,6-tris(trifluoromethyl)phenyl | 2,4,6-tris(trifluoromethyl)phenyl | CN |
| 169. | 3,5-bis(trifluoromethyl)-phenyl | pentafluoroethyl | 3,5-bis(trifluoromethyl)-phenyl |
| 170. | 3,4-bis(trifluoromethyl)-phenyl | 3,4-bis(trifluoromethyl)-phenyl | H |
| 171. | 3,4-bis(trifluoromethyl)-phenyl | trifluoromethyl | H |
| 172. | 3,4-bis(trifluoromethyl)-phenyl | pentafluoroethyl | 3,5-bis(trifluoromethyl)-phenyl |
| 173. | 3,4-bis(trifluoromethyl)-phenyl | pentafluoroethyl | H |
| 174. | 3,4-bis(trifluoromethyl)-phenyl | 3,4-bis(trifluoromethyl)-phenyl | CN |
| 175. | 4-cyano-3-(trifluoromethyl)-phenyl | 3,5-bis(trifluoromethyl)-phenyl | H |
| 176. | 4-cyano-3-(trifluoromethyl)-phenyl | pentafluoroethyl | H |
| 177. | 3,5-bis(trifluoromethyl)-phenyl | pentafluoroethyl | CN |
| 178. | 4-cyano-2,6-bis(trifluoromethyl)-phenyl | 4-cyano-2,6-bis(trifluoromethyl)-phenyl | H |

TABLE 2-continued

| | $R^1$ | $R^2$ | $R^3$ |
|---|---|---|---|
| 179. | 4-cyano-2,6-bis(trifluoromethyl)-phenyl | pentafluoroethyl | H |
| 180. | 2,4-bis(trifluoromethyl)-phenyl | 2,6-bis(trifluoromethyl)-phenyl | H |
| 181. | 2,4-bis(trifluoromethyl)-phenyl | 2,6-bis(trifluoromethyl)-phenyl | CN |
| 182. | 4-(3',5'-bis(trifluoromethyl)phenyl)-2,6-bis(trifluoromethyl)-phenyl | pentafluoroethyl | H |
| 183. | phenyl | phenyl | CN |
| 184. | 3,5-bis(trifluoromethyl)-phenyl | 3,5-bis(trifluoromethyl)-phenyl | $CF_3$ |
| 185. | 3,5-bis(trifluoromethyl)-phenyl | trifluoromethyl | $CF_3$ |
| 186. | phenyl | pentafluoroethyl | $CF_3$ |
| 187. | 3,5-bis(trifluoromethyl)-phenyl | pentafluoroethyl | $CF_3$ |
| 188. | 3,4,5-trifluorophenyl | 3,4,5-trifluorophenyl | $CF_3$ |
| 189. | 4-(trifluoromethyl)phenyl | 4-(trifluoromethyl)phenyl | $CF_3$ |
| 190. | phenyl | phenyl | $CF_3$ |

Especially preferred are the compounds of formula (I.a), wherein $R^1$, $R^2$ and $R^3$ are as defined in table 3:

TABLE 3

| | $R^1$ | $R^2$ | $R^3$ |
|---|---|---|---|
| 191. | pentafluorophenyl | pentafluorophenyl | H |
| 192. | phenyl | phenyl | CN |
| 193. | tert-butyl | tert-butyl | H |
| 194. | tert-butyl | tert-butyl | CN |
| 195. | 3,5-bis(trifluoromethyl)-phenyl | 3,5-bis(trifluoromethyl)-phenyl | H |
| 196. | 3,5-bis(trifluoromethyl)-phenyl | trifluoromethyl | H |
| 197. | phenyl | pentafluoroethyl | H |
| 198. | furan-2-yl | trifluoromethyl | H |
| 199. | furan-2-yl | pentafluoroethyl | H |
| 200. | 3,5-bis(trifluoromethyl)-phenyl | pentafluoroethyl | H |
| 201. | 3',5'-bis(trifluoromethyl)-[1,1'-biphenyl]-4-yl | pentafluoroethyl | H |
| 202. | 3',5'-bis(trifluoromethyl)-[1,1'-biphenyl]-4-yl | trifluoromethyl | H |
| 203. | 4-fluoro-3-trifluoromethyl-phenyl | pentafluoroethyl | H |
| 204. | 4-fluoro-3-trifluoromethyl-phenyl | 3,5-bis(trifluoromethyl)-phenyl | H |
| 205. | 3,4,5-trifluorophenyl | 3,4,5-trifluorophenyl | H |
| 206. | 3,4,5-trifluorophenyl | pentafluoroethyl | H |
| 207. | 4-(trifluoromethyl)phenyl | 4-(trifluoromethyl)phenyl | H |
| 208. | 4-(trifluoromethyl)phenyl | pentafluoroethyl | H |
| 209. | 2,4,6-tris(trifluoromethyl)phenyl | 2,4,6-tris(trifluoromethyl)phenyl | H |
| 210. | 2,4,6-tris(trifluoromethyl)phenyl | Pentafluoroethyl | H |
| 211. | 3,5-bis(trifluoromethyl)-phenyl | 3,5-bis(trifluoromethyl)-phenyl | CN |
| 212. | 2,4,6-tris(trifluoromethyl)phenyl | 2,4,6-tris(trifluoromethyl)phenyl | CN |
| 213. | 3,5-bis(trifluoromethyl)-phenyl | pentafluoroethyl | 3,5-bis(trifluoromethyl)-phenyl |
| 214. | 3,4-bis(trifluoromethyl)-phenyl | 3,4-bis(trifluoromethyl)-phenyl | H |
| 215. | 3,4-bis(trifluoromethyl)-phenyl | trifluoromethyl | H |

TABLE 3-continued

| | $R^1$ | $R^2$ | $R^3$ |
|---|---|---|---|
| 216. | 3,4-bis(trifluoromethyl)-phenyl | pentafluoroethyl | 3,5-bis(trifluoromethyl)-phenyl |
| 217. | 3,4-bis(trifluoromethyl)-phenyl | pentafluoroethyl | H |
| 218. | 3,4-bis(trifluoromethyl)-phenyl | 3,4-bis(trifluoromethyl)-phenyl | CN |
| 219. | 4-cyano-3-(trifluoromethyl)-phenyl | 3,5-bis(trifluoromethyl)-phenyl | H |
| 220. | 4-cyano-3-(trifluoromethyl)-phenyl | pentafluoroethyl | H |
| 221. | 3,5-bis(trifluoromethyl)-phenyl | pentafluoroethyl | CN |
| 222. | 4-cyano-2,6-bis(trifluoromethyl)-phenyl | 4-cyano-2,6-bis(trifluoromethyl)-phenyl | H |
| 223. | 4-cyano-2,6-bis(trifluoromethyl)-phenyl | pentafluoroethyl | H |
| 224. | 2,4-bis(trifluoromethyl)-phenyl | 2,6-bis(trifluoromethyl)-phenyl | H |
| 225. | 2,4-bis(trifluoromethyl)-phenyl | 2,6-bis(trifluoromethyl)-phenyl | CN |
| 226. | 4-(3',5'-bis(trifluoromethyl)phenyl)-2,6-bis(trifluoromethyl)-phenyl | pentafluoroethyl | H |

In formula (I.a) the four ligands $L_2$, $L_3$ and $L_4$ bound to the cerium atom have the same meanings.

The homoleptic compounds of formulae (I.1) and (I) are produced by reacting the β-diketone ligand with a ceric salt. Usually the ceric salt is soluble in the reaction medium. Suitable salts are ceric ammonium nitrate and ceric ammonium sulphate. The β-diketone ligands are either commercial available or they can be prepared by a synthesis known to a skilled person.

The heteroleptic compounds of formula (I.1) are produced by

- mixing two different homoleptic cerium compounds in a suitable solvent,
- mixing a homoleptic cerium compound with a ligand or its alkaline/earth alkaline salt different from the ligands of the compound,
- vapor deposition of two different homoleptic cerium compounds,
- vapor deposition (vapor co-condensation) of homoleptic cerium compounds with a ligand different from the ligands of the compound.

Component

In the context of the invention, an electronic component is understood to be a discrete or integrated electrical component, which uses the properties of compounds of the general formula (I.1) or (I) or semiconductor matrix materials containing a compound of the general formula (I.1) or (I). In a special embodiment, the electronic component has a layer structure comprising in particular 2, 3, 4, 5, 6, 7 or more layers, wherein at least one of the layers contains at least one compound of the general formula (I.1) or (I). In particular, the electronic component has a layer structure comprising in particular 2, 3, 4, 5, 6, 7 or more layers, wherein at least one of the layers contains at least one compound of the general formula (I). Each of the layers may also contain inorganic materials, or the component may also comprise layers, which are composed entirely from inorganic materials.

Preferably, the electronic component is selected from organic field effect transistors (OFETs), organic electroluminescent devices, organic solar cells (OSCs), devices for electrophotography, organic optical detectors, organic photoreceptors, light-emitting electrochemical cells (LECs) and organic laser diodes. Organic field effect transistors (OFETs) are preferably organic thin film transistors (OTFTs). Organic electroluminescent devices are preferably organic light-emitting diodes (OLEDs). Organic solar cells are preferably exciton solar cells, dye sensitized solar cells (DSSCs) or perovskite solar cells. Devices for electrophotography are preferably photoconductive materials in organic photoconductors (OPC).

Preferably, the electronic component according to the invention is in the form of an organic light-emitting diode, an organic solar cell, a photovoltaic cell, an organic diode or an organic transistor, preferably a field effect transistor or thin-film transistor or a Perovskite solar cell.

The electronic component may be preferably an organic electro-luminescent device, in particular in the form of an organic light-emitting diode (OLED). An organic electroluminescent device comprises a cathode, an anode and at least one emitting layer. In addition to these layers, it may also comprise other layers, e.g. one or more hole injection layers, hole transport layers, hole blocking layers, electron transport layers, electron injection layers, exciton blocking layers, electron blocking layers and/or charge generation layers. Intermediate layers, which have e.g. an exciton-blocking-function can also be inserted between two emitting layers. Not all of these layers must necessarily be present.

A preferred embodiment is an electronic component, in particular in the form of an OLED, wherein the layer comprising the compound of formula (I.1) or (I) is a hole transport layer or a hole injection layer. Especially, the electronic component, in particular in the form of an OLED, wherein the layer comprising the compound of formula (I) is a hole transport layer, a hole injection layer or an electron blocking layer. Generally, a hole injection layer is a layer which facilitates electron injection from the anode into the organic semiconductor matrix material. The hole injection layer can be placed directly adjacent to the anode. A hole transport layer transports the holes from the anode to the emitting layer and is located between a hole injection layer and an emitting layer.

A preferred embodiment is an electronic component in the form of an organic solar cell. Generally organic solar cells are layered and usually comprises at least the following layers: anode, at least one photoactive layer and cathode. These layers are generally applied to a substrate commonly used for this purpose. The photoactive region of the solar cell may comprise two layers, each of which has a homogeneous composition and forms a flat donor-acceptor heterojunction. A photoactive region can also comprise a mixed layer and form a donor-acceptor heterojunction in the form of a donor-acceptor bulk heterojunction. In addition to these layers, the organic solar cell can also comprises other layers, e.g. selected from

- Layers with electron transport layer properties (electron transport layer, ETL),
- Layers comprising a hole-conducting material (hole transport layer, HTL), these do not have to absorb radiation,
- Exciton and hole blocking layers (e.g. EBLs), these must not absorb, and
- Multiplier layers.

Another preferred embodiment is an electronic component in the form of an organic solar cell, wherein the layer, which comprises the compound of formula (I.1) or (I), has electron conductivity properties (electron transport layer, ETL). Especially, the electronic component is in the form of an organic solar cell, wherein the layer, which comprises the compound of formula (I), has electron conductivity properties (electron transport layer, ETL).

A special embodiment is an electronic component, especially in the form of an organic solar cell, wherein the layer, which comprises at least one of the compounds of formula (I.1) or (I) is part of a pn-junction connecting a light absorbing unit to an additional light absorbing unit in a tandem device or in a multi-stacked device and/or a pn-junction connecting a cathode or an anode to a light absorbing unit. In particular, the electronic component is in the form of an organic solar cell, wherein the layer which comprises at least one of the compounds of formula (I) is part of a pn-junction connecting a light absorbing unit to an additional light absorbing unit in a tandem device or in a multi-stacked device and/or a pn-junction connecting a cathode or an anode to a light absorbing unit.

Semiconductor Matrix Materials

The compounds of formula (I.1) or (I) according to the invention and used according to the invention, as well as their charge transfer complexes, their reduction products, can be used as doping agents in organic semiconductor matrix materials, in particular as p-dopant in hole transport layers. The doped semiconductor matrix material, preferably comprising at least one electron donor and at least one compound of the formula (I.1) or (I), as defined above. The electron donor is preferably selected from 4,4',4"-tris(N-(2-naphthyl)-N-phenyl-amino)triphenylamine (2-TNATA), 4,4',4"-tris(N-3-methylphenyl-N-phenyl-amino)triphenylamine (m-MTDATA), N,N,N',N'-tetrakis(4-methoxyphenyl)benzidine (MeO-TPD), (2,2',7,7'-tetrakis-(N,N-diphenylamino)-9,9'-spiro-bifluorene (spiro-TTB), N,N'-bis(naphthalen-1-yl)-N,N'-bis(phenyl)-benzidine, N,N'-bis(naphthalen-1-yl)-N,N'-bis(phenyl)-9,9-spiro-bifluorene, 9,9-bis[4-(N,N-bis-biphenyl-4-yl-amino)phenyl]-9H-fluorene, 2,2'-bis[N,N-bis(biphenyl-4-yl)amino]-9,9-spiro-bifluorene, N,N'-((9H-fluorene-9,9-diyl)bis(4,1-phenylene))bis(N-([1,1'-biphenyl]-4-yl)-[1,1'-biphenyl]-4-amine) (BPAPF), N,N'-bis(phenanthren-9-yl)-N,N'-bis(phenyl)-benzidine, 1,3,5-tris{4-[bis(9,9-dimethyl-fluoren-2-yl)amino]phenyl}benzene, tri(terphenyl-4-yl)amine, diaminoterphenylene, diaminotrimethylphenylindanes, N,N'-bis(9,9-dimethylfluoren-2-yl)-N,N'-diphenyl-benzidine (BF-DPB), N,N'-((9H-fluorene-9,9-diyl)bis(4,1-phenylene))bis(N-([1,1'-biphenyl]-4-yl)-[1,1'-biphenyl]-4-amine) (BPAPF), N4,N4,N4',N4'-tetrakis(9,9-dimethyl-9H-fluoren-2-yl)-[1,1'-biphenyl]-4,4'-diamine (TDMFB), N-([1,1'-biphenyl]-2-yl)-N-(9,9-dimethyl-9H-fluoren-2-yl)-9,9'-spirobi[fluoren]-2-amine, (2,7-bis[N,N-bis(4-methoxyphenyl)amino]-9,9-spirobi[9H-fluorene](spiro-MeO-TPD), N([1,1'-biphenyl]-4-yl)-9,9-dimethyl-N-(4-(9-phenyl-9H-carbazol-3-yl)phenyl)-9H-fluoren-2-amine and mixtures thereof.

Suitable diaminoterphenyls are described in DE 102012007795. Diaminotrimethylphenylindanes are described in WO 2018/206769.

In particular, the electron donors are selected from 4,4',4"-tris(N-(2-naphthyl)-N-phenylamino)triphenylamine (2-TNATA), 4,4',4"-tris(N-3-methylphenyl-N-phenyl-amino)triphenylamine (m-MTDATA), N,N,N',N'-tetrakis(4-methoxy-phenyl)benzidine (MeO-TPD), (2,2',7,7'-tetrakis-(N,N-diphenylamino)-9,9'-spirobifluorene (spiro-TTB), N,N'-bis(naphthalen-1-yl)-N,N'-bis(phenyl)-benzidine, N,N'-bis(naphthalen-1-yl)-N,N'-bis(phenyl)-9,9-spiro-bifluorene, 9,9-bis[4-(N,N-bis-biphenyl-4-yl-amino)phenyl]-9H-fluorene, 2,2'-bis[N,N-bis(biphenyl-4-yl)amino]-9,9-spiro-bifluorene, N,N'-((9H-fluoren-9,9-diyl)bis(4,1-phenylen))bis(N-([1,1'-biphenyl]-4-yl)-[1,1'-biphenyl]-4-amine) (BPAPF), N,N'-bis(phenanthren-9-yl)-N,N'-bis (phenyl)-benzidine, 1,3,5-tris{4-[bis(9,9-dimethyl-fluoren-2-yl)amino]phenyl}benzene, tri(terphenyl-4-yl)amine, N-(4-(6-((9,9-dimethyl-9H-fluoren-2-yl)(6-methoxy-[1,1'-biphenyl]-3-yl)amino)-1,3,3-trimethyl-2,3-dihydro-1H-inden-1-yl)phenyl) -N-(6-methoxy-[1,1'-biphenyl]-3-yl)-9,9-dimethyl-9H-fluoren-2-amine, N-([1,1'-biphenyl]-4-yl)-N-(4-(6-([1,1'-biphenyl]-4-yl(9,9-dimethyl-9H-fluoren-2-yl) amino)-1,3,3-trimethyl-2,3-dihydro-1H-inden-1-yl)phenyl)-9,9-dimethyl-9H-fluoren-2-amine, N,N'-di([1,1'-biphenyl]-4-yl)-3-(4-(di([1,1'-biphenyl]-4-yl)amino)phenyl)-1,1,3-trimethyl-2,3-dihydro-1H-inden-5-amine, N-(4-(6-(bis(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)-9,9-dimethyl-9H-fluoren-2-amine, N-(4-(6-(9,9'-spirobi[fluoren]-2-yl(9,9-dimethyl-9H-fluoren-2-yl) amino)-1,3,3-trimethyl-2,3-dihydro-1H-inden-1-yl)phenyl)-N-(9,9-dimethyl-9H-fluoren-2-yl)-9,9'-spirobi[fluoren]-2-amine, N-(4-(6-(dibenzo[b,d]furan-2-yl(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)dibenzo[b,d] furan-2-amine, 9-(4-(6-(9H-carbazol-9-yl)-1,3,3-trimethyl-2,3-dihydro-1H-inden-1-yl)phenyl)-9H-carbazole, N-([1,1'-biphenyl]-4-yl)-3-(4-([1,1'-biphenyl]-4-yl(4-methoxyphenyl)amino)phenyl)-N-(4-methoxyphenyl)-1,1,3-trimethyl-2,3-dihydro-1H-inden-5-amine, 3-(4-(bis(6-methoxy-[1,1'-biphenyl]-3-yl)amino)phenyl)N,N-bis(6-methoxy-[1,1'-biphenyl]-3-yl)-1,1,3-trimethyl-2,3-dihydro-1H-inden-5-amine, N1-([1,1'-biphenyl]-4-yl)-N1-(4-(6-([1,1'-biphenyl]-4-yl(4-(diphenylamino)phenyl)amino)1,3,3-trimethyl-2,3-dihydro-1H-inden-1-yl)phenyl)-N4,N4-diphenylbenzene-1,4-diamine, N,N-di([1,1'-biphenyl]-4-yl)-4'-(6-(4-(di([1,1'-biphenyl]-4-yl)amino)phenyl)-1,3,3-trimethyl-2,3-dihydro-1H-inden-1-yl)-[1,1'-biphenyl]-4-amine, N-(4-(5-(bis(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)-9,9-dimethyl-9H-fluoren-2-amine, N-(4-(6-(bis(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)-9,9-dimethyl-9H-fluoren-2-amine, N,N'-bis(9,9-dimethyl-fluoren-2-yl)N,N'-diphenyl-benzidine (BF-DPB), N,N'-((9H-fluorene-9,9-diyl)bis(4,1-phenylene))bis(N([1,1'-biphenyl]-4-yl)-[1,1'-biphenyl]-4-amine) (BPAPF), N4,N4,N4',N4'-tetrakis(9,9-dimethyl-9H-fluoren-2-yl)-[1,1'-biphenyl]-4,4'-diamine (TDMFB), N-([1,1'-biphenyl]-2-yl)-N(9,9-dimethyl-9H-fluoren-2-yl)-9,9'-spirobi[fluoren]-2-amine, (2,7-bis[N,N-bis(4-methoxyphenyl)amino]-9,9-spirobi[9H-fluorene](spiro-MeO-TPD), a mixture of N-(4-(5-(bis(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)-9,9-dimethyl-9H-fluoren-2-amine and N-(4-(6-(bis(9,9-dimethyl-9H-fluoren-2-yl)amino)-1,3,3-trimethyl-2,3-dihydro-1H-inden-1-yl)phenyl)-N-(9,9-dimethyl-9H-fluoren-2-yl)-9,9-dimethyl-9H-fluoren-2-amine, N-([1,1'-biphenyl]-4-yl)-9,9-dimethyl-N-(4-(9-phenyl-9H-carbazol-3-yl)phenyl)-9H-fluoren-2-amine and mixtures thereof.

Of course, other suitable organic semiconductor matrix materials, especially hole-conducting materials with semiconducting properties, can also be used.

Doping

The doping can take place in particular in such a manner that the molar ratio of matrix molecule to compounds of formula (I.1) or (I) is 10000:1 to 1:1, preferably 1000:1 to 2:1, especially 5:1 to 100:1. In particular, the doping can take place in particular in such a manner that the molar ratio of matrix molecule to compounds of formula (I) is 10000:1 to 1:1, preferably 1000:1 to 2:1, especially 5:1 to 100:1.

Preparation of the Doped Semiconductor Matrix Material

The doping of the particular matrix material (in the following also indicated as hole-conducting matrix HT) with the compounds of the general formula (I.1) or (I) according to the invention and used according to the invention can be produced by one or a combination of the following processes:

a) Mixed evaporation in the vacuum with a source for HT and a source for at least one compound of the general formula (I.1) and (I) in particular at least one compound of the general formula (I).
b) Sequential deposition of HT and at least one compound of the general formula (I.1) or (I), in particular at least one compound of the general formula (I), with subsequent inward diffusion of the doping agent by thermal treatment.
c) Doping of an HT layer by a solution of at least one compound of the general formula (I.1) or (I), in particular at least one compound of the general formula (I), with subsequent evaporation of the solvent by thermal treatment.
d) Surface doping of an HT layer by a layer of at least one compound of the general formula (I.1) or (I), in particular at least one compound of the general formula (I), applied on either or both surfaces of the HT layer.
e) Preparation of a solution of host and at least one compound of the general formula (I.1) or (I), in particular at least one compound of the general formula (I), and forming a film from the solution e.g. by coating, casting or printing techniques or other film preparing techniques known to a person skilled in the art.

Another object of the invention is the use of a compound (I.1) or a mixture thereof or the use of a compound (I) or a mixture thereof, in particular the use of a compound (I) or a mixture thereof as defined above as organic semiconductor,
as doping agent in organic semiconductor matrix materials, especially as p-dopant in hole transport layers,
as electron transport material,
as charge injector in a charge injection layer,
as cathode material in organic batteries,
as electrochromic material.

A further object of the invention is the use of Ce(III) complex anions obtained by reduction of a compound (I.1) or (I) as defined above or of charge transfer complexes of a compound (I.1) or (I) as defined above with electron donors as organic conductor or as electrochromic material.

A further object of the invention are compounds of the general formula (I.1)

$$Ce^{4+}(L_1L_2L_3L_4)^{4-} \quad (I.1),$$

and mixtures thereof, wherein $L_1$; $L_2$; $L_3$; and $L_4$ are independently from each other a bidentate ligand having the general formula (I.2)

(I.2)

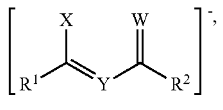

wherein

X and W independently from each other represent O, S or $NR^6$;

Y represents N or $CR^3$;

$R^1$, $R^2$ independently from each other represent CN, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$, $R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl;

with the proviso that the following compounds are excluded:

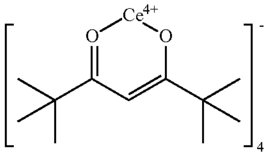
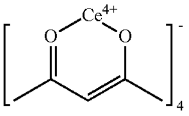
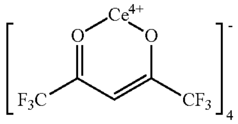
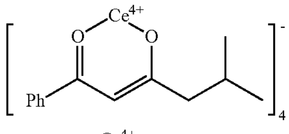
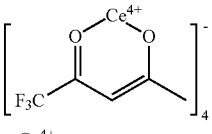
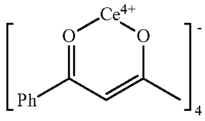
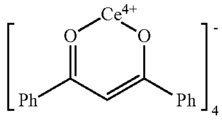
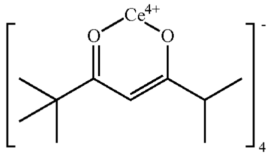

-continued

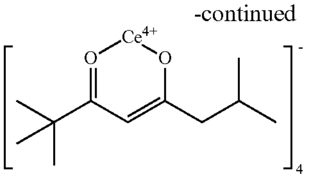
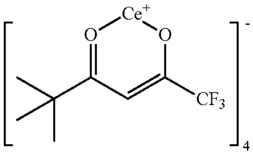
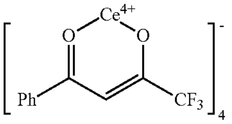
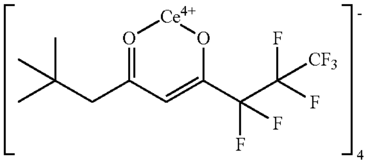
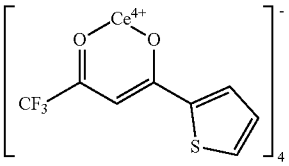
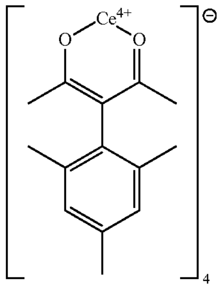
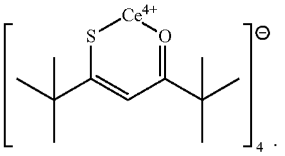

A further object of the invention are compounds of the general formula (I)

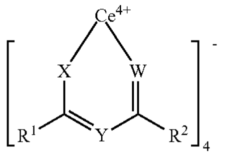

(I)

and their charge transfer complexes, their reduction products and mixtures thereof, wherein X and W independently from each other represent 0, S or $NR^6$;

Y represents N or $CR^3$;

$R^1$, $R^2$ independently from each other represent CN, $C_1$-$C_6$ alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, nitro, halogen, $C_1$-$C_6$-alkyl, $C_1$-$C_6$-haloalkyl, $C_1$-$C_6$-alkoxy, $C_1$-$C_6$-haloalkoxy, $C_1$-$C_6$-alkylsulfanyl, $C_1$-$C_6$-haloalkylsulfanyl, $NR^{4a}R^{4b}$, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$;

$R^{4a}R^{4b}$ independently from each other represent hydrogen, $C_1$-$C_6$-alkyl or $C_6$-$C_{14}$-aryl, wherein aryl is unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^6$ represents hydrogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^5$, $R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl;

with the proviso that the following compounds are excluded:

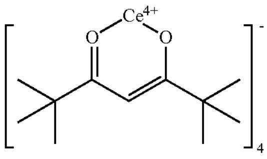
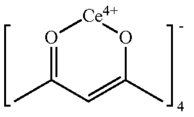
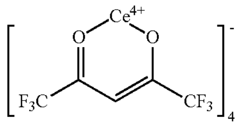
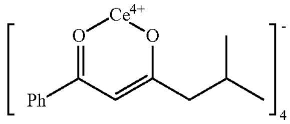
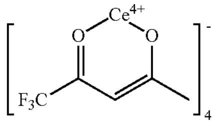
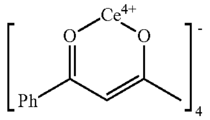
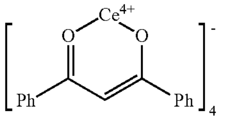
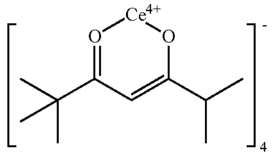
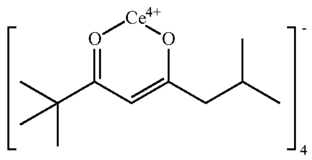

-continued

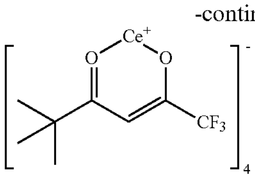
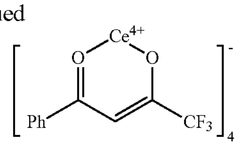
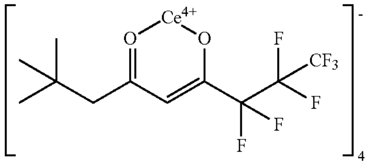
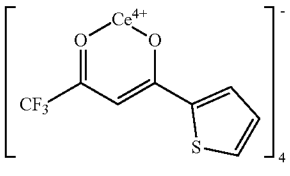
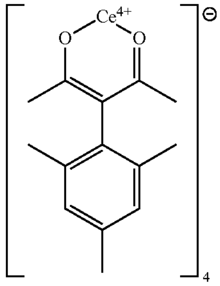
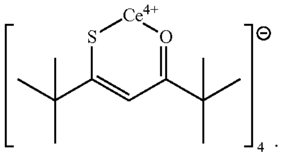

The following examples illustrate the invention without limiting it in any way.

EXAMPLES

Synthesis of 1:

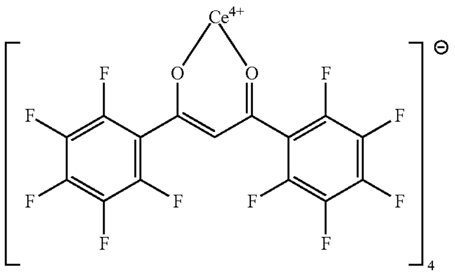

1,3-bis(perfluorophenyl)propane-1,3-dione was prepared according to literature (R. Filler et al., J. Org. Chem. 35(4), 1970, 930).

1,3-Bis(perfluorophenyl)propane-1,3-dione (1.61 g, 4.00 mmol) was dissolved in ethanol (50 ml) and 1M NaOH in ethanol (4 ml, 4 mmol) was added. The solution was stirred for 5 minutes, then ceric (IV) ammonium nitrate (0.55 g, 1 mmol) was added. The dark red solution was stirred for 2 hours. The volatiles were removed in vacuo and the residue suspended in hexane (40 ml). After refluxing for 10 min, the suspension was filtered while hot and the filtrate was allowed to cool to room temperature. Dark red crystals were isolated by vacuum filtration and dried under vacuum. The solid was recrystallized from hexane filtered and dried (0.77 g, 0.43 mmol, 44% yield).

$^1H$ NMR (300 MHz, $CDCl_3$) δ 6.09.

$^{19}F$ NMR (282 MHz, $CDCl_3$) δ −139.25, −139.31, −149.63, −149.70, −149.78, −160.69, −160.70, −160.73, −160.78, −160.80, −160.85, −160.88, −160.89.

Melting point: 183° C.

Cyclovoltametry in dichloromethane showed the following:

$$E_{1/2}(\text{vs. } Fc/Fc^{+})=+0.13\text{ V}$$

Cyclovoltametry in acetonitrile showed the following:

$$E_{1/2}(\text{vs. } Fc/Fc^{+})=+0.1\text{ V}$$

Preparation of the samples:

A substrate (laboratory glass 1×1 cm) was cleaned with acetone, ethanol and isopropanol in an ultrasonic bath.

The following solutions/concentrations were used for solvent processing:

1. spiro-MeO-TAD (N2,N2,N2',N2',N7,N7,N7',N7'-octakis(4-methoxyphenyl)-9,9'-spirobi[9H-fluoren]-2,2',7,7'-tetramine) in chlorobenzene: 30 mg/ml
2. Dopant 1 and Spiro-MeO-TAD and in chlorbenzene: 3 mg/ml (dopant 1) and 30 mg/ml Spiro-MeO-TAD A spincoater from Sawatec AG, Switzerland, was used for the application of the layers. For this purpose, the substrate surface was wetted with solution (a drop was placed in the middle of the substrate). The spin coating was carried out for 60 seconds at 1000 rpm with closed lid and open ventilation slits. Subsequently, gold metal contacts were deposited by evaporation in a vacuum (10-7 mbar) (30 nm, 1 Å/s).

Conductivity Spiro-MeG-TAD without dopant: $<1\cdot10^{-9}$ S/cm

Conductivity Spiro-MeG-TAD with 10 wt % 1 as dopant: $8.4\cdot10^{-5}$ S/cm

The compound has been solution processed together with the hole transport material CAS [1364603-07-5]. At a doping concentration of 4 mol % a conductivity of $2.6\cdot10^{-6}$ S/cm has been achieved.

Synthesis of 2:

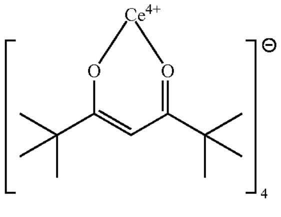

Compound 2 is commercially available and was sublimated without decomposition. The sublimation temperature $T_{Tsubl}$ was 130 to 140° C. (pressure; $2\cdot10^{-6}$ mbar).

Synthesis of 3:

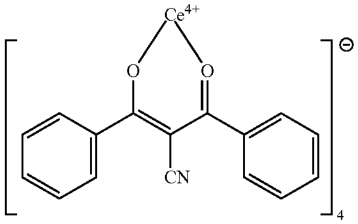

2-Benzoyl-3-oxo-3-phenylpropanenitrile was prepared according to literature (Lava R. Kadel, John R. Kromer, Curtis E. Moore, David M. Eichhorn Polyhedron 125, 2017, 206-218.).

2-Benzoyl-3-oxo-3-phenylpropanenitrile (0,50 g, 2 mmol) was dissolved in ethanol (15 ml), and 1M NaOH in ethanol (2 ml, 2 mmol) was added. The solution was stirred for 5 minutes, then ceric(IV) ammonium nitrate (0,27 g, 0.5 mmol) dissolved in ethanol (5 ml) was added. The dark red solution was stirred for 15 min and after that filtered. The dark solid was washed with water (100 ml) and ethanol (10 ml) and dried. 460 mg of a dark red solid were obtained.

Cyclovoltametry in dichloromethane showed the following potential:

$$E^{1/2}(\text{vs. } Fc/Fc^{+})=+0.03\text{ V}$$

Synthesis of 4:

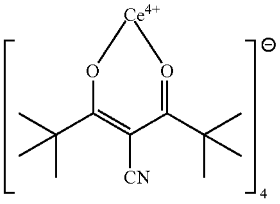

4,4-Dimethyl-3-oxo-2-pivaloylpentanenitrile was prepared according to literature (C. M. Silvernail et al., Polyhedron 20, 2001, 3113.).

4,4-Dimethyl-3-oxo-2-pivaloylpentanenitril (0,84 g, 4 mmol) was dissolved in ethanol (30 ml), and 1M NaOH in ethanol (4 ml, 4 mmol) was added. The solution was stirred for 5 minutes, then ceric(IV) ammonium nitrate (0,55 g, 1 mmol) dissolved in ethanol (10 ml) was added. The dark red solution was stirred for 15 min. The solvent was removed in vacuo. The residue was extracted with diethylether (50 ml) and filtered. The solvent of the filtrate was removed under vacuum. Dark red solid, 500 mg, 51% yield.

Compound 4 was sublimated. A dark red solid was obtained. The sublimation temperature $T_{subl}$ was 160° C. (pressure; $2\cdot10^{-6}$ mbar).

Cyclovoltametry in dichloromethane showed the following potential:

$$E_{1/2}(\text{vs. } Fc/Fc^{+})=-0.08\text{ V}$$

Synthesis of 5

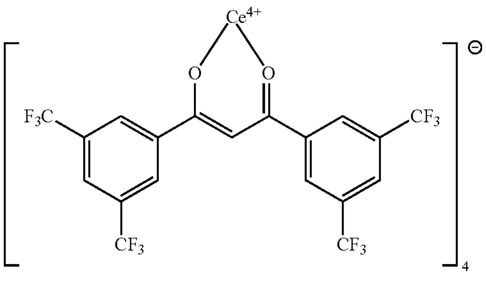

Diisopropylamine (3 g, 30 mmol) was dissolved in 25 mL dry toluene. The solution was cooled to 0° C. and n-BuLi (n-butyllithium, 1.6M in hexane, 19 mL, 30 mmol) was added. After 10 min, 3',5'-Bis(trifluoromethyl)acetophenone (7.68 g, 30 mmol) was added. After 1 min, 3',5' bis(trifluoromethyl)benzoyl chloride (5.5 g, 20 mmol) was added and the cooling bath was removed. After 2 min, acetic acid conc. (10 mL) was added followed by 20 mL of water and 10 mL of toluene. The two phases were separated, the organic phase was dried over $MgSO_4$ and rotated off under reduced pressure. The crude diketone was recrystallized from hexane (yield of 1,3-bis(3,5-bis(trifluoromethyl)phenyl)propane-1,3-dione 3.2 g, 6.45 mmol, 33%).

1,3-bis(3,5-bis(trifluoromethyl)phenyl)propane-1,3-dione (2.57 g, 5.18 mmol) was dissolved in ethanol (100 ml) and 1M NaOH in ethanol (5.2 ml, 5.2 mmol) was added. The solution was stirred for 5 minutes, then a solution of ceric ammonium nitrate (0.71 g, 1.3 mmol) in ethanol (40 ml) was added. The dark red solution was stirred for 15 min and filtered. The volatiles were removed in vacuo and the residue was redissolved in dichloromethane (DCM, 300 ml) and washed with water (100 ml). The organic phase was then dried over $MgSO_4$ and concentrated under reduced pressure. Hexane (400 mL) was added to yield purple crystals, which were filtered and dried under vacuum (2.5 g, 1.17 mmol, 90% yield).

Melting point: 237° C. (onset) at 10 K/min, determined with DSC

Cyclovoltametry in acetonitrile showed the following potential:

$$E_{1/2}(\text{vs. } Fc/Fc^+(\text{MeCN}) := -0.04 \text{ V}$$

The compound 5 was co-evaporated with the hole transport material spiro-MeO-TPD (2,7-bis[N,N-bis(4-methoxyphenyl)amino]-9,9-spirobi[9H-fluoren]. At a doping concentration of 3 mol % a conductivity of $8.2 \cdot 10^{-5}$ S/cm has been achieved.

The compound was co-evaporated with the hole transport material MeO-TPD (N,N,N',N'-tetrakis(4-methoxy-phenyl) benzidine). At a doping concentration of 3 mol % a conductivity of $5.2 \cdot 10^{-5}$ S/cm has been achieved.

Synthesis of 6

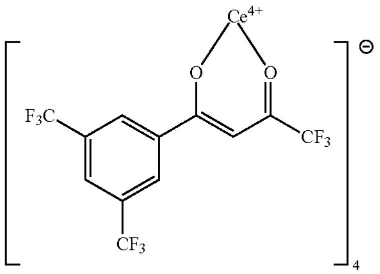

1-(3,5-bis(trifluoromethyl)phenyl)-4,4,4-trifluorobutane-1,3-dione was prepared according to literature (Liu et al., Molecules 2016, 21, 828.).

1-(3,5-bis(trifluoromethyl)phenyl)-4,4,4-trifluorobutane-1,3-dione (2 g, 5.68 mmol) was dissolved in ethanol (50 ml) and 1M NaOH in ethanol (5.6 ml, 5.6 mmol) was added. The solution was stirred for 5 minutes, then a solution of ceric (IV) ammonium nitrate (0.78 g, 1.42 mmol) in ethanol (20 ml) was added. The dark red solution was stirred for 15 min and filtered. The volatiles were removed in vacuo and the residue redissolved in dichloromethane (300 ml), washed with water (100 ml). The organic phase was then dried over $MgSO_4$ and concentrated under reduced pressure. Hexane (50 mL) was added to the mixture and the latter was stored at −20° C. overnight. The isolated solid was then recrystallized from hot hexane (1 g, 0.64 mmol, 45%).

Melting point: 155° C. (peak) at 10 K/min determined with DSC

Cyclovoltametry in acetonitrile showed the following potential:

$$E_{1/2}(\text{vs. } Fc/Fc^+(\text{MeCN}) := +0.35 \text{ V}$$

The compound 6 was co-evaporated with the hole transport material BF-DPB (N,N'-bis(9,9-dimethyl-fluoren-2-yl)-N,N'-diphenyl-benzidine). With a doping concentration of 6 mol % a conductivity of $7.2 \cdot 10^{-6}$ S/cm has been achieved.

The compound was co-evaporated with the hole transport material MeO-TPD.

With a doping concentration of 9 mol % a conductivity of $1.6 \cdot 10^{-4}$ S/cm has been achieved.

The compound was co-evaporated with the hole transport material BPAPF.

With a doping concentration of 13 mol % a conductivity of $3 \cdot 10^{-5}$ S/cm has been achieved.

Synthesis of 7

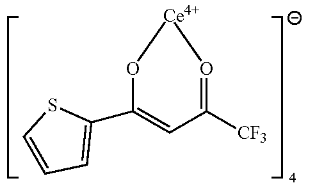

4,4,4-trifluoro-1-(thiophen-2-yl)butane-1,3-dione is commercial available.

4,4,4-trifluoro-1-(thiophen-2-yl)butane-1,3-dione (1.8 g, 8.1 mmol) was dissolved in ethanol (40 ml) and 1M NaOH in ethanol (8.1 ml, 8.1 mmol) was added. The solution was stirred for 5 minutes, then a solution of ceric (IV) ammonium nitrate (1.11 g, 2 mmol) in ethanol (20 ml) was added. The dark red precipitate was stirred for 15 min and filtered. The solid was rinsed with water (100 ml). The latter was redissolved in dichloromethane (400 ml) and washed with water (2×200 ml). The organic phase was then dried over $MgSO_4$ and concentrated under reduced pressure. Hexane (300 mL) was added to yield purple crystals, which were filtered, rinsed with hexane (50 ml), pentane (50 ml) and dried under vacuum (1.5 g, 1.46 mmol, 73% yield).

Melting point: 209° C. (peak) at 10 K/min determined with DSC

Cyclovoltametry in acetonitrile showed the following potential:

$$E_{1/2}(\text{vs. } Fc/Fc^+(\text{MeCN}) := +0.20 \text{ V}$$

Synthesis of 8

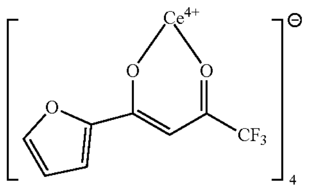

4,4,4-trifluoro-1-(furan-2-yl)butane-1,3-dione is commercial available.

4,4,4-trifluoro-1-(furan-2-yl)butane-1,3-dione (1.57 g, 7.6 mmol) was dissolved in ethanol (40 ml) and 1M NaOH in ethanol (7.6 ml, 7.6 mmol) was added. The solution was stirred for 5 minutes, then a solution of ceric (IV) ammonium nitrate (1.04 g, 1.9 mmol) in ethanol (20 ml) was added. The dark red precipitate was stirred for 15 min and filtered. The solid was rinsed with water (100 ml). The latter was redissolved in dichloromethane (300 ml) and washed with water (100 ml). The organic phase was then dried over $MgSO_4$ and concentrated under reduced pressure. Hexane (200 mL) was added to yield to purple crystals, which were filtered, rinsed with pentane (100 ml) and dried under vacuum (yield: 1.2 g, 1.32 mmol, 66%).

Melting point: 166° C. (peak) at 10 K/min determined with DSC.

Cyclovoltametry in acetonitrile showed the following potential:

$E_{1/2}$(vs. $Fc/Fc^+$(MeCN):=+0.24 V

Synthesis of 9

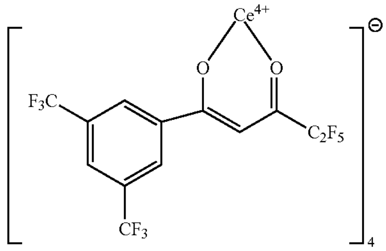

3',5' Bis(trifluoromethyl)acetophenone (4.32 g, 16.9 mmol) and ethyl 2,2,3,3,3-pentafluoropropanoate (4.86 g, 25.3 mmol) were dissolved in dry methanol (100 ml). MeONa (1.82, 33.8 mmol) in methanol (10 ml) was added and the mixture was refluxed for 2 hours. The resulting solutions was evaporated under reduced pressure. The crude was redissolved in EtOAc (100 ml) and HCl (6 M, 50 ml) was added. The organic phase was separated, dried over $MgSO_4$ and rotated off. The red oily diketone was purified by vacuum distillation yielding to a pale yellow oil of 1-(3,5-bis(trifluoromethyl)phenyl)4,4,5,5,5-pentafluoropentane-1,3-dione (yield: 4.8 g, 12 mmol, 71%).

1-(3,5-Bis(trifluoromethyl)phenyl)-4,4,5,5,5-pentafluoropentane-1,3-dione (2.22 g, 5.52 mmol) was dissolved in ethanol (50 ml) and 1M NaOH in ethanol (5.5 ml, 5.5 mmol) was added. The solution was stirred for 5 minutes, then a solution of ceric ammonium nitrate (0.76 g, 1.38 mmol) in ethanol (15 ml) was added. The dark red solution was stirred for 15 min and filtered. The solution was evaporated under reduced pressure. The red oil was extracted with hexane (10 ml) and crystallized upon standing overnight at room temperature. The isolated solid was recrystallized from hot hexane and stored at −20° C. (yield 2.02 g, 1.16 mmol, 84%).

Melting point: 129° C. (peak) at 10 K/min determined with DSC Cyclovoltametry in acetonitrile showed the following potential:

$E_{1/2}$(vs. $Fc/Fc^+$(MeCN):=+0.46 V

Synthesis of 10

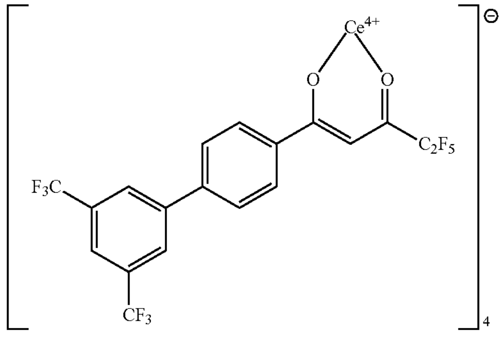

1-(3',5'-Bis(trifluoromethyl)-[1,1'-biphenyl]-4-yl)ethan-1-one (4 g, 12 mmol) was dissolved in THF (50 mL). The mixture was cooled to 0° C. and NaH (1.44 g, 60 mmol) was added. The reaction mixture was stirred for 20 min, then ethyl 2,2,3,3,3-pentafluoropropanoate (6.9 g, 36 mmol) was added. The cold bath was removed and the mixture was stirred overnight. The solution was concentrated under reduced pressure, water (20 mL) was added followed by HCl (6M, 15 mL). The mixture was extracted with ethyl acetate (300 mL). The organic phase was washed with water (50 mL) and brine (50 mL), dried over $MgSO_4$ and rotated off. The crude material was purified by filtration over silica (DCM as eluent), yielding a pale red solid of 1-(3',5'-bis(trifluoromethyl)-[1,1'-biphenyl]-4-yl)-4,4,4-trifluorobutane-1,3-dione (yield: 3.2 g, 62%).

1-(3',5'-bis(trifluoromethyl)-[1,1'-biphenyl]-4-yl)-4,4,5,5,5-pentafluoropentane-1,3-dione (1.52 g, 3.17 mmol) was dissolved in ethanol (50 ml) and 1M NaOH in ethanol (3.2 ml, 3.2 mmol) was added. The solution was stirred for 5 minutes, then a solution of ceric (IV) ammonium nitrate (0.43 g, 0.79 mmol) in ethanol (20 ml) was added. The dark red solution was stirred for 15 min and filtered. The volatiles were removed in vacuo and the residue was redissolved in DCM (250 ml) and washed with water (100 ml). The organic phase was dried over $MgSO_4$ and rotated off under reduced pressure. The mixture was redissolved in DCM (50 mL) and hexane (200 mL) was added. The solution was concentrated under reduced pressure and stored at −20° C. yielding dark red crystals, which were filtered and dried under vacuum (yield 0.6 g, 0.3 mmol, 37%).

Melting point: 214° C. (peak) at 10 K/min determined with DSC

Cyclovoltametry in acetonitrile showed the following potential:

$E_{1/2}$(vs. $Fc/Fc^+$:=+0.43 V

Synthesis of 11

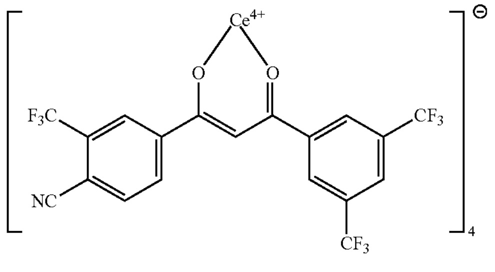

Methyl 4-cyano-3-(trifluoromethyl)benzoate (2.09 g, 9.12 mmol) was dissolved in THF (50 mL). The mixture was cooled to 0° C. and NaH (706 mg, 29.4 mmol) was added. The reaction mixture was stirred for 20 min, then 1-(3,5-bis(trifluoromethyl)phenyl)ethan-1-one (1.95 g, 7.6 mmol) was added. The cold bath was removed and the mixture was stirred overnight. The solution was concentrated under reduced pressure, water (10 mL) was added followed by HCl (6M, 10 mL). The mixture was extracted with ethyl acetate (40 mL). The organic phase was washed with water (50 mL) and brine (50 mL), dried over $MgSO_4$ and rotated off. The crude material was purified recrystallization from hot EtOH, yielding a colorless microcrystalline solid (1.32 g, 39%).

Complex:

4-(3-(3,5-bis(trifluoromethyl)phenyl)-3-oxopropanoyl)-2-(trifluoromethyl)benzonitrile (1.32 g, 2.91 mmol) was dissolved in EtOH (50 ml) and 1M NaOH in EtOH (2.9 ml, 2.9 mmol) was added. The solution was stirred for 5 minutes, then a solution of ceric ammonium nitrate (0.4 g, 0.73 mmol) in EtOH (20 ml) was added. The dark red solution was stirred for 15 min and concentrated under reduced pressure. The dark red precipitate was filtered and rinsed with water (50 mL), EtOH (5 mL) and hexanes (15 mL). The isolated solid was dried under vacuum (1.06 g, 1.16 mmol, 75%).

Potential measured in acetonitrile+0.10V vs. $Fc/Fc^+$.

Synthesis of 12 (Mixture of Homoleptic and Heteroleptic Cer-Complexes)

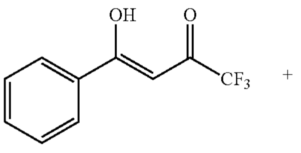

$L^1$

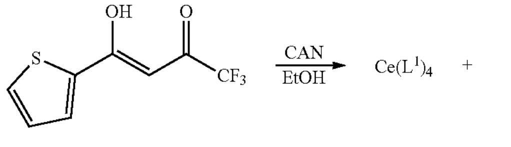

$L^2$ $Ce(L^1)_3L^2$ + $Ce(L^1)_2(L^2)_2$ + $Ce(L^2)_3L^1$ + $Ce(L^2)_4$

A mixture of the ligands $L^1$ (1.00 g) and $L^2$ (1.02 g) with the molar ratio of 1:1) has been dissolved in 10 ml of EtOH. 9.2 ml of a 1M-solution of NaOH in EtOH was added in one portion while stirring. 1.26 g of ceric ammonium nitrate (CAN) dissolved in 10 ml of EtOH were added dropwise. The red precipitated was filtered off and washed two times with water. After drying the red powder was analyzed by mass spectrometry (Atmospheric Pressure Chemical Ionization APCI-, Advion ASAP Mass Spectrometer). The mass spectrum indicated formation of the two homoleptic complexes $Ce(L^1)_4$ and $Ce(L^2)_4$ as well as all possible heteroleptic complexes as depicted above.

Synthesis of 13: (Heteroleptic Cer-Complex)

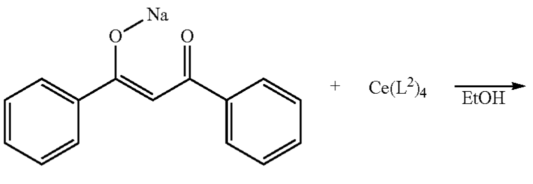

$NaL^3$

-continued

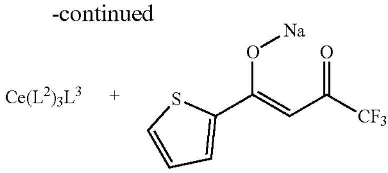

$NaL^2$ 52 mg of ligand salt $NaL^3$ were dissolved in 10 ml EtOH and 216 mg of the complex $Ce(L^2)_4$ were added. To the resulting suspension, 5 ml of THF were added and a homogeneous red solution was formed. Mass spectrometric analysis (Atmospheric Pressure Chemical Ionization APCI-, Advion ASAP Mass Spectrometer) of that solution showed partial formation of the new complex $Ce(L^2)_3L^3$.

The invention claimed is:

1. An electronic component comprising 4, 5, 6, 7 or more layers comprising a hole transport layer and/or a hole injection layer, which comprises at least one compound of the general formula (I.1)

$$Ce^{4+}(L_1L_2L_3L_4)^{4-} \quad (I.1)$$

or mixtures thereof, wherein $L_1$; $L_2$; $L_3$; and $L_4$ are independently from each other selected from a bidentate ligand having the general formula (I.2)

(I.2)

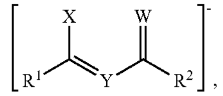

wherein

X and W independently from each other represent O;

Y represents $CR^3$;

$R^1$, $R^2$ independently from each other represent $C_1$-$C_6$-alkyl, $C_1$-$C_6$-haloalkyl, $C_1$-$C_6$-haloalkoxy, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, halogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, O, S, SO and $SO_2$, wherein aryl and hetaryl are unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl.

2. The electronic component according to claim 1 comprising a hole transport layer and/or a hole injection layer, which comprises at least one compound of the general formula (I)

(I)

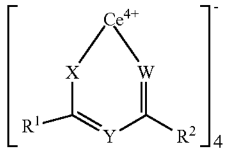

or mixtures thereof, wherein

X and W independently from each other represent O;

Y represents $CR^3$;

$R^1$, $R^2$ independently from each other represent, $C_1$-$C_6$-alkyl, $C_1$-$C_6$-haloalkyl, $C_1$-$C_6$-haloalkoxy, $C_6$-$C_{14}$-aryl or hetaryl having 4 to 13 carbon atoms, wherein hetaryl has 1, 2 or 3 identical or different heteroatoms or heteroatom-containing groups as ring members, selected from N, $NR^7$, O, S, SO and $SO_2$, wherein aryl and hetaryl are unsubstituted or substituted by 1, 2, 3, 4 or 5 identical or different radicals $R^8$;

$R^3$ represents hydrogen, CN, halogen, $C_1$-$C_6$-alkyl, $C_1$-$C_6$-haloalkyl, $C_6$-$C_{14}$-aryl or hetaryl having 4 to 13 carbon atoms, wherein hetaryl has 1, 2 or 3 identical or different heteroatoms or heteroatom-containing groups as ring members, selected from N, O, S, SO and $SO_2$, wherein aryl and hetaryl are unsubstituted or substituted by 1, 2, 3, 4 or 5 identical or different radicals $R^5$;

$R^5$ represents CN, halogen, $C_1$-$C_4$-alkyl or $C_1$-$C_4$-haloalkyl;

$R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$;

$R^8$ represents CN, halogen, $C_1$-$C_4$-alkyl, $C_1$-$C_4$-haloalkyl or $C_6$-$C_{14}$-aryl, which is unsubstituted or substituted by 1, 2 or 3 identical or different radicals selected from $C_1$-$C_4$-alkyl and $C_1$-$C_4$-haloalkyl.

3. The electronic component according to claim 1, wherein $R^1$ and $R^2$ in ligands of formula (I.2) are independently selected from $C_1$-$C_6$-alkyl, $C_1$-$C_6$-haloalkyl, $C_1$-$C_6$-haloalkoxy, and the group A consisting of A1, A2, A3, A4, A5, A6, A7, A8, A9, A10, A11, A12, A13, A14, A15, A16, A17, A18 and A19

A1

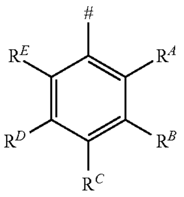

A2

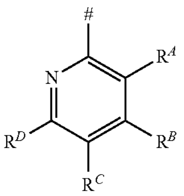

-continued

A3

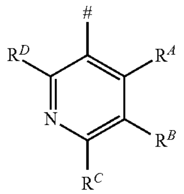

A4

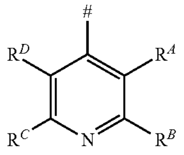

A5

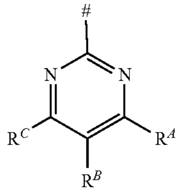

A6

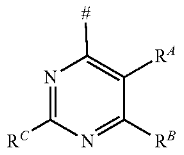

A7

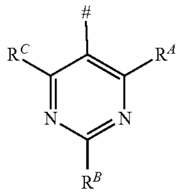

A8

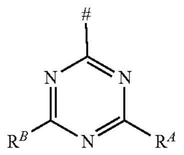

A9

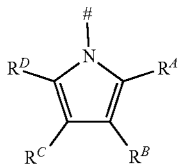

A10

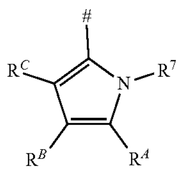

A11

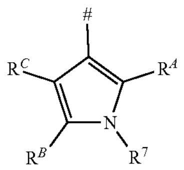

-continued

A12

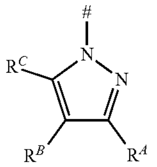

A13

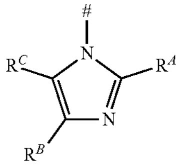

A14

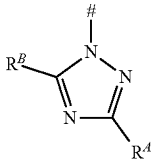

A15

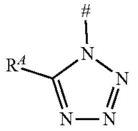

A16

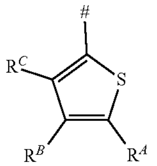

A17

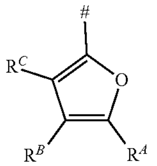

A18

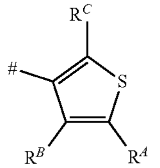

A19

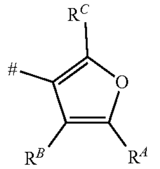

where # denotes the bond to the remaining molecule of formula (I.2), $R^A$, $R^B$, $R^C$, $R^D$ and $R^E$ are independently selected from hydrogen, CN, halogen, $C_1$-$C_4$-alkyl, $C_1$-$C_4$-haloalkyl and phenyl, which is unsubstituted or substituted by 1, 2 or 3 identical or different radicals selected from $C_1$-$C_4$-alkyl and $C_1$-$C_4$-haloalkyl;

$R^5$ represents CN, halogen, $C_1$-$C_4$-alkyl or $C_1$-$C_4$-haloalkyl; and $R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$.

4. The electronic component according to claim 3, wherein in A1, A2, A3, A4, A5, A6, A7, A8, A9, A10, A11, A12, A13, A14 and A15 the radicals $R^A$, $R^B$, $R^C$, $R^D$ and $R^E$ are independently from another selected from hydrogen, CN, fluorine, chlorine, $C_1$-$C_4$-alkyl, $C_1$-$C_4$-fluoroalkyl, $C_1$-$C_4$-chloroalkyl and phenyl, which is unsubstituted or substituted by 1, 2 or 3 identical or different radicals selected from $C_1$-$C_4$-haloalkyl.

5. The electronic component according claim 1, wherein in ligands of formula (I.2) Y represents the radical $CR^3$, wherein $R^3$ is selected from hydrogen, CN, nitro, halogen, $CF_3$ and the group B consisting B1, B2, B3, B4, B5, B6, B7, B8, B9, B10, B11, B12, B13, B14 and B15

B1

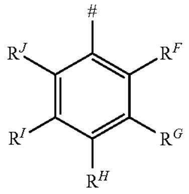

B2

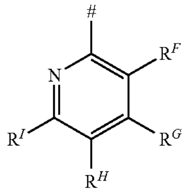

B3

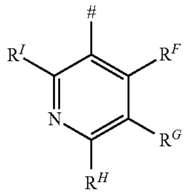

B4

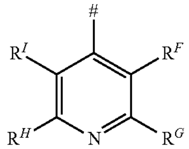

B5

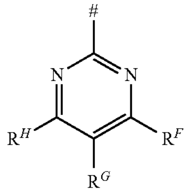

B6

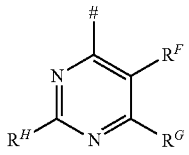

-continued

B7

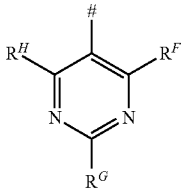

B8

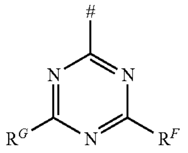

B9

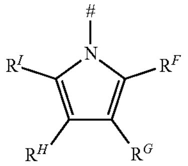

B10

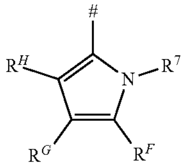

B11

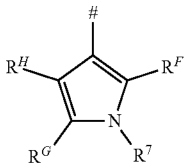

B12

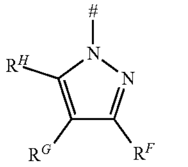

B13

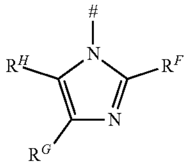

B14

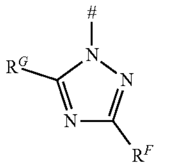

B15

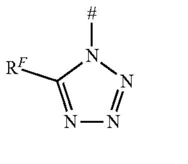

where # denotes the bond to the remaining molecule of formula (I.2), $R^F$, $R^G$, $R^H$, $R^I$ and $R^J$ are independently selected from hydrogen, CN, halogen, $C_1$-$C_4$-alkyl and $C_1$-$C_4$-haloalkyl; and $R^7$ represents hydrogen, $C_1$-$C_6$-alkyl, $C_1$-$C_6$-haloalkyl or $C_6$-$C_{14}$-aryl, wherein aryl is unsubstituted or substituted by 1, 2, 3, 4 or 5 identical or different radicals $R^5$.

6. The electronic component according to claim 1, wherein in ligands of formula (I.2) $R^1$ and $R^2$ are independently selected from $C_1$-$C_4$-alkyl, $C_1$-$C_4$-haloalkyl, A1, A5, A16 and A17

A1

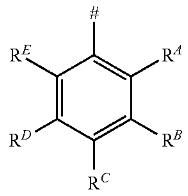

A5

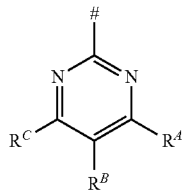

A16

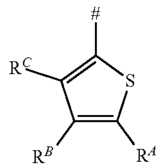

A17

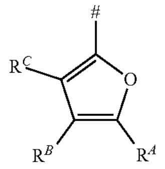

where # denotes the bond to the remaining molecule of formula (I.2), and wherein $R^A$, $R^B$, $R^C$, $R^D$ and $R^E$ are independently selected from hydrogen, CN, fluorine, chlorine, $C_1$-$C_4$-alkyl, $C_1$-$C_4$-fluoroalkyl, $C_1$-$C_4$-chloroalkyl and phenyl, which is unsubstituted or substituted by 1, 2 or 3 identical or different radicals selected from $C_1$-$C_4$-haloalkyl.

7. The electronic component according to claim 1, wherein in ligands of formula (I.2) Y represents a radical $CR^3$ and wherein $R^3$ is selected from hydrogen, CN, halogen, $CF_3$ and B1

B1

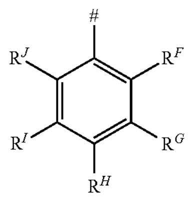

where # denotes the bond to the remaining molecule of formulae (I.2) and (I), and wherein $R^F$, $R^G$, $R^H$, $R^I$ and $R^J$ are independently selected from hydrogen, CN, fluorine and chlorine.

8. The electronic component according to claim 1, wherein the compounds of formula (I.1) are selected from compounds of formula (I.a')

$Ce^{4+}[(R^1—C(—O)=C(R^3)—C(=O)—R^2)(R^{1'}—C(—O)=C(R^{3'})—C(=O)—R^{2'})(R^{1''}—C(—O)=C(R^{3''})—C(=O)—R^{2''})(R^{1'''}—C(—O)=C(R^{3'''})—C(=O)—R^{2'''})]^{4-}$ (I.a'), wherein ($R^1$, $R^2$, $R^3$), ($R^{1'}$, $R^{2'}$, $R^{3'}$), ($R^{1''}$, $R^{2''}$, $R^{3''}$) and ($R^{1'''}$, $R^{2'''}$, $R^{3'''}$) are each selected from the definition given in one line of the following table:

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| methyl | methyl | H |
| methyl | methyl | CN |
| methyl | methyl | F |
| methyl | methyl | Cl |
| methyl | methyl | $NO_2$ |
| methyl | methyl | pentafluorophenyl |
| methyl | methyl | tetrafluoro-2-(trifluoromethyl)phenyl |
| methyl | methyl | tetrafluoro-3-(trifluoromethyl)phenyl |
| methyl | methyl | tetrafluoro-4-(trifluoromethyl)phenyl |
| methyl | methyl | tetrafluoro-2-pyridyl |
| methyl | methyl | tetrafluoro-3-pyridyl |
| methyl | methyl | tetrafluoro-4-pyridyl |
| methyl | methyl | tetrafluoro-2-benzonitrile |
| methyl | methyl | tetrafluoro-3-benzonitrile |
| methyl | methyl | tetrafluoro-4-benzonitrile |
| trifluoromethyl | trifluoromethyl | H |
| trifluoromethyl | trifluoromethyl | CN |
| trifluoromethyl | trifluoromethyl | F |
| trifluoromethyl | trifluoromethyl | Cl |
| trifluoromethyl | trifluoromethyl | $NO_2$ |
| trifluoromethyl | trifluoromethyl | pentafluorophenyl |
| trifluoromethyl | trifluoromethyl | tetrafluoro-2-(trifluoromethyl)phenyl |
| trifluoromethyl | trifluoromethyl | tetrafluoro-3-(trifluoromethyl)phenyl |
| trifluoromethyl | trifluoromethyl | tetrafluoro-4-(trifluoromethyl)phenyl |
| trifluoromethyl | trifluoromethyl | tetrafluoro-2-pyridyl |
| trifluoromethyl | trifluoromethyl | tetrafluoro-3-pyridyl |
| trifluoromethyl | trifluoromethyl | tetrafluoro-4-pyridyl |
| trifluoromethyl | trifluoromethyl | tetrafluoro-2-benzonitrile |
| trifluoromethyl | trifluoromethyl | tetrafluoro-3-benzonitrile |
| trifluoromethyl | trifluoromethyl | tetrafluoro-4-benzonitrile |
| pentafluoroethyl | pentafluoroethyl | H |
| pentafluoroethyl | pentafluoroethyl | CN |
| pentafluoroethyl | pentafluoroethyl | F |
| pentafluoroethyl | pentafluoroethyl | Cl |
| pentafluoroethyl | pentafluoroethyl | $NO_2$ |
| pentafluoroethyl | pentafluoroethyl | pentafluorophenyl |
| pentafluoroethyl | pentafluoroethyl | tetrafluoro-2-(trifluoromethyl)phenyl |
| pentafluoroethyl | pentafluoroethyl | tetrafluoro-3-(trifluoromethyl)phenyl |
| pentafluoroethyl | pentafluoroethyl | tetrafluoro-4-(trifluoromethyl)phenyl |
| pentafluoroethyl | pentafluoroethyl | tetrafluoro-2-pyridyl |
| pentafluoroethyl | pentafluoroethyl | tetrafluoro-3-pyridyl |
| pentafluoroethyl | pentafluoroethyl | tetrafluoro-4-pyridyl |
| pentafluoroethyl | pentafluoroethyl | tetrafluoro-2-benzonitrile |
| pentafluoroethyl | pentafluoroethyl | tetrafluoro-3-benzonitrile |

-continued

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| pentafluoroethyl | pentafluoroethyl | tetrafluoro-4-benzonitrile |
| heptafluoro-n-propyl | heptafluoro-n-propyl | H |
| heptafluoro-n-propyl | heptafluoro-n-propyl | CN |
| heptafluoro-n-propyl | heptafluoro-n-propyl | F |
| heptafluoro-n-propyl | heptafluoro-n-propyl | Cl |
| heptafluoro-n-propyl | heptafluoro-n-propyl | $NO_2$ |
| heptafluoro-n-propyl | heptafluoro-n-propyl | pentafluorophenyl |
| heptafluoro-n-propyl | heptafluoro-n-propyl | tetrafluoro-2-(trifluoromethyl)phenyl |
| heptafluoro-n-propyl | heptafluoro-n-propyl | tetrafluoro-3-(trifluoromethyl)phenyl |
| heptafluoro-n-propyl | heptafluoro-n-propyl | tetrafluoro-4-(trifluoromethyl)phenyl |
| heptafluoro-n-propyl | heptafluoro-n-propyl | tetrafluoro-2-pyridyl |
| heptafluoro-n-propyl | heptafluoro-n-propyl | tetrafluoro-3-pyridyl |
| heptafluoro-n-propyl | heptafluoro-n-propyl | tetrafluoro-4-pyridyl |
| heptafluoro-n-propyl | heptafluoro-n-propyl | tetrafluoro-2-benzonitrile |
| heptafluoro-n-propyl | heptafluoro-n-propyl | tetrafluoro-3-benzonitrile |
| heptafluoro-n-propyl | heptafluoro-n-propyl | tetrafluoro-4-benzonitrile |
| heptafluoro-isopropyl | heptafluoro-isopropyl | H |
| heptafluoro-isopropyl | heptafluoro-isopropyl | CN |
| heptafluoro-isopropyl | heptafluoro-isopropyl | F |
| heptafluoro-isopropyl | heptafluoro-isopropyl | Cl |
| heptafluoro-isopropyl | heptafluoro-isopropyl | $NO_2$ |
| heptafluor-iso-propyl | heptafluoro-isopropyl | pentafluorophenyl |
| heptafluor-iso-propyl | heptafluoro-isopropyl | tetrafluoro-2-(trifluoromethyl)phenyl |
| heptafluoro-isopropyl | heptafluoro-isopropyl | tetrafluoro-3-(trifluoromethyl)phenyl |
| heptafluoro-isopropyl | heptafluoro-isopropyl | tetrafluoro-4-(trifluoromethyl)phenyl |
| heptafluoro-isopropyl | heptafluoro-isopropyl | tetrafluoro-2-pyridyl |
| heptafluoro-isopropyl | heptafluoro-isopropyl | tetrafluoro-3-pyridyl |
| heptafluoro-isopropyl | heptafluoro-isopropyl | tetrafluoro-4-pyridyl |
| heptafluoro-isopropyl | heptafluoro-isopropyl | tetrafluoro-2-benzonitrile |
| heptafluoro-isopropyl | heptafluoro-isopropyl | tetrafluoro-3-benzonitrile |
| heptafluoro-isopropyl | heptafluoro-isopropyl | tetrafluoro-4-benzonitrile |
| tert-butyl | tert-butyl | H |
| tert-butyl | tert-butyl | CN |
| tert-butyl | tert-butyl | F |
| tert-butyl | tert-butyl | Cl |
| tert-butyl | tert-butyl | $NO_2$ |
| tert-butyl | tert-butyl | pentafluorophenyl |
| tert-butyl | tert-butyl | tetrafluoro-2-(trifluoromethyl)phenyl |

-continued

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| tert-butyl | tert-butyl | tetrafluoro-3-(trifluoromethyl)phenyl |
| tert-butyl | tert-butyl | tetrafluoro-4-(trifluoromethyl)phenyl |
| tert-butyl | tert-butyl | tetrafluoro-2-pyridyl |
| tert-butyl | tert-butyl | tetrafluoro-3-pyridyl |
| tert-butyl | tert-butyl | tetrafluoro-4-pyridyl |
| tert-butyl | tert-butyl | tetrafluoro-2-benzonitrile |
| tert-butyl | tert-butyl | tetrafluoro-3-benzonitrile |
| tert-butyl | tert-butyl | tetrafluoro-4-benzonitrile |
| nonafluoro-n-butyl | nonafluoro-n-butyl | H |
| nonafluoro-n-butyl | nonafluoro-n-butyl | CN |
| nonafluoro-n-butyl | nonafluoro-n-butyl | F |
| nonafluoro-n-butyl | nonafluoro-n-butyl | Cl |
| nonafluoro-n-butyl | nonafluoro-n-butyl | $NO_2$ |
| nonafluoro-n-butyl | nonafluoro-n-butyl | pentafluorophenyl |
| nonafluoro-n-butyl | nonafluoro-n-butyl | tetrafluoro-2-(trifluoromethyl)phenyl |
| nonafluoro-n-butyl | nonafluoro-n-butyl | tetrafluoro-3-(trifluoromethyl)phenyl |
| nonafluoro-n-butyl | nonafluoro-n-butyl | tetrafluoro-4-(trifluoromethyl)phenyl |
| nonafluoro-n-butyl | nonafluoro-n-butyl | tetrafluoro-2-pyridyl |
| nonafluoro-n-butyl | nonafluoro-n-butyl | tetrafluoro-3-pyridyl |
| nonafluoro-n-butyl | nonafluoro-n-butyl | tetrafluoro-4-pyridyl |
| nonafluoro-n-butyl | nonafluoro-n-butyl | tetrafluoro-2-benzonitrile |
| nonafluoro-n-butyl | nonafluoro-n-butyl | tetrafluoro-3-benzonitrile |
| nonafluoro-n-butyl | nonafluoro-n-butyl | tetrafluoro-4-benzonitrile |
| pentafluorophenyl | pentafluorophenyl | H |
| pentafluorophenyl | pentafluorophenyl | CN |
| pentafluorophenyl | pentafluorophenyl | F |
| pentafluorophenyl | pentafluorophenyl | Cl |
| pentafluorophenyl | pentafluorophenyl | $NO_2$ |
| pentafluorophenyl | pentafluorophenyl | pentafluorophenyl |
| pentafluorophenyl | pentafluorophenyl | tetrafluoro-2-(trifluoromethyl)phenyl |
| pentafluorophenyl | pentafluorophenyl | tetrafluoro-3-(trifluoromethyl)phenyl |
| pentafluorophenyl | pentafluorophenyl | tetrafluoro-4-(trifluoromethyl)phenyl |
| pentafluorophenyl | pentafluorophenyl | tetrafluoro-2-pyridyl |
| pentafluorophenyl | pentafluorophenyl | tetrafluoro-3-pyridyl |
| pentafluorophenyl | pentafluorophenyl | tetrafluoro-4-pyridyl |
| pentafluorophenyl | pentafluorophenyl | tetrafluoro-2-benzonitrile |
| pentafluorophenyl | pentafluorophenyl | tetrafluoro-3-benzonitrile |
| pentafluorophenyl | pentafluorophenyl | tetrafluoro-4-benzonitrile |
| 4-pyrimidy | 4-pyrimidy | H |
| 4-pyrimidy | 4-pyrimidy | CN |
| 4-pyrimidy | 4-pyrimidy | F |
| 4-pyrimidy | 4-pyrimidy | Cl |
| 4-pyrimidy | 4-pyrimidy | $NO_2$ |
| 4-pyrimidy | 4-pyrimidy | pentafluorophenyl |
| 4-pyrimidy | 4-pyrimidy | tetrafluoro-2-(trifluoromethyl)phenyl |
| 4-pyrimidy | 4-pyrimidy | tetrafluoro-3-(trifluoromethyl)phenyl |
| 4-pyrimidy | 4-pyrimidy | tetrafluoro-4-(trifluoromethyl)phenyl |
| 4-pyrimidy | 4-pyrimidy | tetrafluoro-2-pyridyl |
| 4-pyrimidy | 4-pyrimidy | tetrafluoro-3-pyridyl |
| 4-pyrimidy | 4-pyrimidy | tetrafluoro-4-pyridyl |
| 4-pyrimidy | 4-pyrimidy | tetrafluoro-2-benzonitrile |
| 4-pyrimidy | 4-pyrimidy | tetrafluoro-3-benzonitrile |
| 4-pyrimidy | 4-pyrimidy | tetrafluoro-4-benzonitrile |
| 2-pyrimidy | 2-pyrimidy | H |
| 2-pyrimidy | 2-pyrimidy | CN |
| 2-pyrimidy | 2-pyrimidy | F |

-continued

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| 2-pyrimidy | 2-pyrimidy | Cl |
| 2-pyrimidy | 2-pyrimidy | $NO_2$ |
| 2-pyrimidy | 2-pyrimidy | pentafluorophenyl |
| 2-pyrimidy | 2-pyrimidy | tetrafluoro-2-(trifluoromethyl)phenyl |
| 2-pyrimidy | 2-pyrimidy | tetrafluoro-3-(trifluoromethyl)phenyl |
| 2-pyrimidyl | 2-pyrimidyl | tetrafluoro-4-(trifluoromethyl)phenyl |
| 2-pyrimidyl | 2-pyrimidyl | tetrafluoro-2-pyridyl |
| 2-pyrimidyl | 2-pyrimidyl | tetrafluoro-3-pyridyl |
| 2-pyrimidyl | 2-pyrimidyl | tetrafluoro-4-pyridyl |
| 2-pyrimidyl | 2-pyrimidyl | tetrafluoro-2-benzonitrile |
| 2-pyrimidyl | 2-pyrimidyl | tetrafluoro-3-benzonitrile |
| 2-pyrimidyl | 2-pyrimidyl | tetrafluoro-4-benzonitrile |
| 3,5-bis(trifluoromethyl)-phenyl | 3,5-bis(trifluoromethyl)-phenyl | H |
| 3,5-bis(trifluoromethyl)-phenyl | trifluoromethyl | H |
| phenyl | pentafluoroethyl | H |
| furan-2-yl | trifluoromethyl | H |
| furan-2-yl | pentafluoroethyl | H |
| 3,5-bis(trifluoromethyl)-phenyl | pentafluoroethyl | H |
| 3',5'-bis(trifluoromethyl)-[1,1'-biphenyl]-4-yl | pentafluoroethyl | H |
| 3',5'-bis(trifluoromethyl)-[1,1'-biphenyl]-4-yl | trifluoromethyl | H |
| 4-fluoro-3-trifluoromethyl-phenyl | pentafluoroethyl | H |
| 4-fluoro-3-trifluoromethyl-phenyl | 3,5-bisftrifluoromethyl)-phenyl | H |
| 3,4,5-trifluorophenyl | 3,4,5-trifluorophenyl | H |
| 3,4,5-trifluorophenyl | pentafluoroethyl | H |
| 4-(trifluoromethyl) phenyl | 4-(trifluoromethyl) phenyl | H |
| 4-(trifluoromethyl) phenyl | pentafluoroethyl | H |
| 2,4,6-tris(trifluoromethyl) phenyl | 2,4,6-tris(trifluoromethyl) phenyl | H |
| 2,4,6-tris(trifluoromethyl) phenyl | Pentafluoroethyl | H |
| 3,5-bis(trifluoromethyl)-phenyl | 3,5-bis(trifluoromethyl)-phenyl | CN |
| 2,4,6-tris(trifluoromethyl) phenyl | 2,4,6-tris(trifluoromethyl) phenyl | CN |
| 3,5-bis(trifluoromethyl)-phenyl | pentafluoroethyl | 3,5-bis(trifluoromethyl)-phenyl |
| 3,4-bis(trifluoromethyl)-phenyl | 3,4-bis(trifluoromethyl)-phenyl | H |
| 3,4-bis(trifluoromethyl)-phenyl | trifluoromethyl | H |
| 3,4-bis(trifluoromethyl)-phenyl | pentafluoroethyl | 3,5-bis(trifluoromethyl)-phenyl |
| 3,4-bis(trifluoromethyl)-phenyl | pentafluoroethyl | H |

-continued

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| 3,4-bis(trifluoromethyl)-phenyl | 3,4-bis(trifluoromethyl)-phenyl | CN |
| 4-cyano-3-(trifluoromethyl)-phenyl | 3,5-bis(trifluoromethyl)-phenyl | H |
| 4-cyano-3-(trifluoromethyl)-phenyl | pentafluoroethyl | H |
| 3,5-bis(trifluoromethyl)-phenyl | pentafluoroethyl | CN |
| 4-cyano-2,6-bis(trifluoromethyl)-phenyl | 4-cyano-2,6-bis(trifluoromethyl)-phenyl | H |
| 4-cyano-2,6-bis(trifluoromethyl)-phenyl | pentafluoroethyl | H |
| 2,4-bis(trifluoromethyl)-phenyl | 2,6-bis(trifluoromethyl)-phenyl | H |
| 2,4-bis(trifluoromethyl)-phenyl | 2,6-bis(trifluoromethyl)-phenyl | CN |
| 4-(3',5'-bis(trifluoromethyl) phenyl)-2,6-bis(trifluoromethyl)-phenyl | pentafluoroethyl | H |
| phenyl | phenyl | CN |
| 3,5-bis(trifluoromethyl)-phenyl | 3,5-bis(trifluoromethyl)-phenyl | $CF_3$ |

-continued

| $R^1$, $R^{1'}$, $R^{1''}$, $R^{1'''}$ | $R^2$, $R^{2'}$, $R^{2''}$, $R^{2'''}$ | $R^3$, $R^{3'}$, $R^{3''}$, $R^{3'''}$ |
|---|---|---|
| 3,5-bis(trifluoromethyl)-phenyl | trifluoromethyl | $CF_3$ |
| phenyl | pentafluoroethyl | $CF_3$ |
| 3,5-bis(trifluoromethyl)-phenyl | pentafluoroethyl | $CF_3$ |
| 3,4,5-trifluorophenyl | 3,4,5-trifluorophenyl | $CF_3$ |
| 4-(trifluoromethyl) phenyl | 4-(trifluoromethyl) phenyl | $CF_3$ |
| phenyl | phenyl | $CF_3$. |

9. The electronic component according to claim 1, wherein the compounds of formula (I.1) are selected from compounds of formula (I.a)

(I.a)

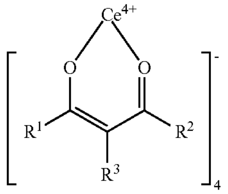

wherein $R^1$, $R^2$ and $R^3$ are selected from

| $R^1$ | $R^2$ | $R^3$ |
|---|---|---|
| methyl | methyl | H |
| methyl | methyl | CN |
| methyl | methyl | F |
| methyl | methyl | Cl |
| methyl | methyl | $NO_2$ |
| methyl | methyl | pentafluorophenyl |
| methyl | methyl | tetrafluoro-2-(trifluoromethyl)phenyl |
| methyl | methyl | tetrafluoro-3-(trifluoromethyl)phenyl |
| methyl | methyl | tetrafluoro-4-(trifluoromethyl)phenyl |
| methyl | methyl | tetrafluoro-2-pyridyl |
| methyl | methyl | tetrafluoro-3-pyridyl |
| methyl | methyl | tetrafluoro-4-pyridyl |
| methyl | methyl | tetrafluoro-2-benzonitrile |
| methyl | methyl | tetrafluoro-3-benzonitrile |
| methyl | methyl | tetrafluoro-4-benzonitrile |
| trifluoromethyl | trifluoromethyl | H |
| trifluoromethyl | trifluoromethyl | CN |
| trifluoromethyl | trifluoromethyl | F |
| trifluoromethyl | trifluoromethyl | Cl |
| trifluoromethyl | trifluoromethyl | $NO_2$ |
| trifluoromethyl | trifluoromethyl | pentafluorophenyl |
| trifluoromethyl | trifluoromethyl | tetrafluoro-2-(trifluoromethyl)phenyl |
| trifluoromethyl | trifluoromethyl | tetrafluoro-3-(trifluoromethyl)phenyl |
| trifluoromethyl | trifluoromethyl | tetrafluoro-4-(trifluoromethyl)phenyl |
| trifluoromethyl | trifluoromethyl | tetrafluoro-2-pyridyl |
| trifluoromethyl | trifluoromethyl | tetrafluoro-3-pyridyl |
| trifluoromethyl | trifluoromethyl | tetrafluoro-4-pyridyl |
| trifluoromethyl | trifluoromethyl | tetrafluoro-2-benzonitrile |
| trifluoromethyl | trifluoromethyl | tetrafluoro-3-benzonitrile |
| trifluoromethyl | trifluoromethyl | tetrafluoro-4-benzonitrile |
| pentafluoroethyl | pentafluoroethyl | H |
| pentafluoroethyl | pentafluoroethyl | CN |
| pentafluoroethyl | pentafluoroethyl | F |
| pentafluoroethyl | pentafluoroethyl | Cl |
| pentafluoroethyl | pentafluoroethyl | $NO_2$ |
| pentafluoroethyl | pentafluoroethyl | pentafluorophenyl |
| pentafluoroethyl | pentafluoroethyl | tetrafluoro-2-(trifluoromethyl)phenyl |
| pentafluoroethyl | pentafluoroethyl | tetrafluoro-3-(trifluoromethyl)phenyl |
| pentafluoroethyl | pentafluoroethyl | tetrafluoro-4-(trifluoromethyl)phenyl |

-continued

| $R^1$ | $R^2$ | $R^3$ |
|---|---|---|
| pentafluoroethyl | pentafluoroethyl | tetrafluoro-2-pyridyl |
| pentafluoroethyl | pentafluoroethyl | tetrafluoro-3-pyridyl |
| pentafluoroethyl | pentafluoroethyl | tetrafluoro-4-pyridyl |
| pentafluoroethyl | pentafluoroethyl | tetrafluoro-2-benzonitrile |
| pentafluoroethyl | pentafluoroethyl | tetrafluoro-3-benzonitrile |
| pentafluoroethyl | pentafluoroethyl | tetrafluoro-4-benzonitrile |
| heptafluoro-n-propyl | heptafluoro-n-propyl | H |
| heptafluoro-n-propyl | heptafluoro-n-propyl | CN |
| heptafluoro-n-propyl | heptafluoro-n-propyl | F |
| heptafluoro-n-propyl | heptafluoro-n-propyl | Cl |
| heptafluoro-n-propyl | heptafluoro-n-propyl | $NO_2$ |
| heptafluoro-n-propyl | heptafluoro-n-propyl | pentafluorophenyl |
| heptafluoro-n-propyl | heptafluoro-n-propyl | tetrafluoro-2-(trifluoromethyl)phenyl |
| heptafluoro-n-propyl | heptafluoro-n-propyl | tetrafluoro-3-(trifluoromethyl)phenyl |
| heptafluoro-n-propyl | heptafluoro-n-propyl | tetrafluoro-4-(trifluoromethyl)phenyl |
| heptafluoro-n-propyl | heptafluoro-n-propyl | tetrafluoro-2-pyridyl |
| heptafluoro-n-propyl | heptafluoro-n-propyl | tetrafluoro-3-pyridyl |
| heptafluoro-n-propyl | heptafluoro-n-propyl | tetrafluoro-4-pyridyl |
| heptafluoro-n-propyl | heptafluoro-n-propyl | tetrafluoro-2-benzonitrile |
| heptafluoro-n-propyl | heptafluoro-n-propyl | tetrafluoro-3-benzonitrile |
| heptafluoro-n-propyl | heptafluoro-n-propyl | tetrafluoro-4-benzonitrile |
| heptafluoro-isopropyl | heptafluoro-isopropyl | H |
| heptafluoro-isopropyl | heptafluoro-isopropyl | CN |
| heptafluoro-isopropyl | heptafluoro-isopropyl | F |
| heptafluoro-isopropyl | heptafluoro-isopropyl | Cl |
| heptafluoro-isopropyl | heptafluoro-isopropyl | $NO_2$ |
| heptafluor-iso-propyl | heptafluoro-isopropyl | pentafluorophenyl |
| heptafluor-iso-propyl | heptafluoro-isopropyl | tetrafluoro-2-(trifluoromethyl)phenyl |
| heptafluoro-isopropyl | heptafluoro-isopropyl | tetrafluoro-3-(trifluoromethyl)phenyl |
| heptafluoro-isopropyl | heptafluoro-isopropyl | tetrafluoro-4-(trifluoromethyl)phenyl |
| heptafluoro-isopropyl | heptafluoro-isopropyl | tetrafluoro-2-pyridyl |
| heptafluoro-isopropyl | heptafluoro-isopropyl | tetrafluoro-3-pyridyl |
| heptafluoro-isopropyl | heptafluoro-isopropyl | tetrafluoro-4-pyridyl |
| heptafluoro-isopropyl | heptafluoro-isopropyl | tetrafluoro-2-benzonitrile |
| heptafluoro-isopropyl | heptafluoro-isopropyl | tetrafluoro-3-benzonitrile |
| heptafluoro-isopropyl | heptafluoro-isopropyl | tetrafluoro-4-benzonitrile |
| tert-butyl | tert-butyl | H |
| tert-butyl | tert-butyl | CN |
| tert-butyl | tert-butyl | F |
| tert-butyl | tert-butyl | Cl |
| tert-butyl | tert-butyl | $NO_2$ |
| tert-butyl | tert-butyl | pentafluorophenyl |
| tert-butyl | tert-butyl | tetrafluoro-2-(trifluoromethyl)phenyl |
| tert-butyl | tert-butyl | tetrafluoro-3-(trifluoromethyl)phenyl |
| tert-butyl | tert-butyl | tetrafluoro-4-(trifluoromethyl)phenyl |
| tert-butyl | tert-butyl | tetrafluoro-2-pyridyl |
| tert-butyl | tert-butyl | tetrafluoro-3-pyridyl |

-continued

| R[1] | R[2] | R[3] |
|---|---|---|
| tert-butyl | tert-butyl | tetrafluoro-4-pyridyl |
| tert-butyl | tert-butyl | tetrafluoro-2-benzonitrile |
| tert-butyl | tert-butyl | tetrafluoro-3-benzonitrile |
| tert-butyl | tert-butyl | tetrafluoro-4-benzonitrile |
| nonafluoro-n-butyl | nonafluoro-n-butyl | H |
| nonafluoro-n-butyl | nonafluoro-n-butyl | CN |
| nonafluoro-n-butyl | nonafluoro-n-butyl | F |
| nonafluoro-n-butyl | nonafluoro-n-butyl | Cl |
| nonafluoro-n-butyl | nonafluoro-n-butyl | $NO_2$ |
| nonafluoro-n-butyl | nonafluoro-n-butyl | pentafluorophenyl |
| nonafluoro-n-butyl | nonafluoro-n-butyl | tetrafluoro-2-(trifluoromethyl)phenyl |
| nonafluoro-n-butyl | nonafluoro-n-butyl | tetrafluoro-3-(trifluoromethyl)phenyl |
| nonafluoro-n-butyl | nonafluoro-n-butyl | tetrafluoro-4-(trifluoromethyl)phenyl |
| nonafluoro-n-butyl | nonafluoro-n-butyl | tetrafluoro-2-pyridyl |
| nonafluoro-n-butyl | nonafluoro-n-butyl | tetrafluoro-3-pyridyl |
| nonafluoro-n-butyl | nonafluoro-n-butyl | tetrafluoro-4-pyridyl |
| nonafluoro-n-butyl | nonafluoro-n-butyl | tetrafluoro-2-benzonitrile |
| nonafluoro-n-butyl | nonafluoro-n-butyl | tetrafluoro-3-benzonitrile |
| nonafluoro-n-butyl | nonafluoro-n-butyl | tetrafluoro-4-benzonitrile |
| pentafluorophenyl | pentafluorophenyl | H |
| pentafluorophenyl | pentafluorophenyl | CN |
| pentafluorophenyl | pentafluorophenyl | F |
| pentafluorophenyl | pentafluorophenyl | Cl |
| pentafluorophenyl | pentafluorophenyl | $NO_2$ |
| pentafluorophenyl | pentafluorophenyl | pentafluorophenyl |
| pentafluorophenyl | pentafluorophenyl | tetrafluoro-2-(trifluoromethyl)phenyl |
| pentafluorophenyl | pentafluorophenyl | tetrafluoro-3-(trifluoromethyl)phenyl |
| pentafluorophenyl | pentafluorophenyl | tetrafluoro-4-(trifluoromethyl)phenyl |
| pentafluorophenyl | pentafluorophenyl | tetrafluoro-2-pyridyl |
| pentafluorophenyl | pentafluorophenyl | tetrafluoro-3-pyridyl |
| pentafluorophenyl | pentafluorophenyl | tetrafluoro-4-pyridyl |
| pentafluorophenyl | pentafluorophenyl | tetrafluoro-2-benzonitrile |
| pentafluorophenyl | pentafluorophenyl | tetrafluoro-3-benzonitrile |
| pentafluorophenyl | pentafluorophenyl | tetrafluoro-4-benzonitrile |
| 4-pyrimidyl | 4-pyrimidyl | H |
| 4-pyrimidyl | 4-pyrimidyl | CN |
| 4-pyrimidyl | 4-pyrimidyl | F |
| 4-pyrimidyl | 4-pyrimidyl | Cl |
| 4-pyrimidyl | 4-pyrimidyl | $NO_2$ |
| 4-pyrimidyl | 4-pyrimidyl | pentafluorophenyl |
| 4-pyrimidyl | 4-pyrimidyl | tetrafluoro-2-(trifluoromethyl)phenyl |
| 4-pyrimidyl | 4-pyrimidyl | tetrafluoro-3-(trifluoromethyl)phenyl |
| 4-pyrimidyl | 4-pyrimidyl | tetrafluoro-4-(trifluoromethyl)phenyl |
| 4-pyrimidyl | 4-pyrimidyl | tetrafluoro-2-pyridyl |
| 4-pyrimidyl | 4-pyrimidyl | tetrafluoro-3-pyridyl |
| 4-pyrimidyl | 4-pyrimidyl | tetrafluoro-4-pyridyl |
| 4-pyrimidyl | 4-pyrimidyl | tetrafluoro-2-benzonitrile |
| 4-pyrimidyl | 4-pyrimidyl | tetrafluoro-3-benzonitrile |
| 4-pyrimidyl | 4-pyrimidyl | tetrafluoro-4-benzonitrile |
| 2-pyrimidyl | 2-pyrimidyl | H |
| 2-pyrimidyl | 2-pyrimidyl | CN |
| 2-pyrimidyl | 2-pyrimidyl | F |
| 2-pyrimidyl | 2-pyrimidyl | Cl |
| 2-pyrimidyl | 2-pyrimidyl | $NO_2$ |
| 2-pyrimidyl | 2-pyrimidyl | pentafluorophenyl |
| 2-pyrimidyl | 2-pyrimidyl | tetrafluoro-2-(trifluoromethyl)phenyl |
| 2-pyrimidyl | 2-pyrimidyl | tetrafluoro-3-(trifluoromethyl)phenyl |
| 2-pyrimidyl | 2-pyrimidyl | tetrafluoro-4-(trifluoromethyl)phenyl |
| 2-pyrimidyl | 2-pyrimidyl | tetrafluoro-2-pyridyl |
| 2-pyrimidyl | 2-pyrimidyl | tetrafluoro-3-pyridyl |
| 2-pyrimidyl | 2-pyrimidyl | tetrafluoro-4-pyridyl |
| 2-pyrimidyl | 2-pyrimidyl | tetrafluoro-2-benzonitrile |
| 2-pyrimidyl | 2-pyrimidyl | tetrafluoro-3-benzonitrile |
| 2-pyrimidyl | 2-pyrimidyl | tetrafluoro-4-benzonitrile |
| 3,5-bis(trifluoromethyl)-phenyl | 3,5-bis(trifluoromethyl)-phenyl | H |
| 3,5-bis(trifluoromethyl)-phenyl | trifluoromethyl | H |
| phenyl | pentafluoroethyl | H |
| furan-2-yl | trifluoromethyl | H |
| furan-2-yl | pentafluoroethyl | H |
| 3,5-bis(trifluoromethyl)-phenyl | pentafluoroethyl | H |

-continued

| $R^1$ | $R^2$ | $R^3$ |
|---|---|---|
| 3',5'-bis(trifluoromethyl)-[1,1'-biphenyl]-4-yl | pentafluoroethyl | H |
| 3',5'-bis(trifluoromethyl)-[1,1'-biphenyl]-4-yl | trifluoromethyl | H |
| 4-fluoro-3-trifluoromethyl-phenyl | pentafluoroethyl | H |
| 4-fluoro-3-trifluoromethyl-pheny | 3,5-bis(trifluoromethyl)-phenyl | H |
| 3,4,5-trifluorophenyl | 3,4,5-trifluorophenyl | H |
| 3,4,5-trifluorophenyl | pentafluoroethyl | H |
| 4-(trifluoromethyl)phenyl | 4-(trifluoromethyl)phenyl | H |
| 4-(trifluoromethyl)phenyl | pentafluoroethyl | H |
| 2,4,6-tris(trifluoromethyl)phenyl | 2,4,6-tris(trifluoromethyl)phenyl | H |
| 2,4,6-tris(trifluoromethyl)phenyl | Pentafluoroethyl | H |
| 3,5-bis(trifluoromethyl)-phenyl | 3,5-bis(trifluoromethyl)-phenyl | CN |
| 2,4,6-tris(trifluoromethyl)phenyl | 2,4,6-tris(trifluoromethyl)phenyl | CN |
| 3,5-bis(trifluoromethyl)-phenyl | pentafluoroethyl | 3,5-bis(trifluoromethyl)-phenyl |
| 3,4-bis(trifluoromethyl)-phenyl | 3,4-bis(trifluoromethyl)-phenyl | H |
| 3,4-bis(trifluoromethyl)-phenyl | trifluoromethyl | H |
| 3,4-bis(trifluoromethyl)-phenyl | pentafluoroethyl | 3,5-bis(trifluoromethyl)-phenyl |
| 3,4-bis(trifluoromethyl)-phenyl | pentafluoroethyl | H |
| 3,4-bis(trifluoromethyl)-phenyl | 3,4-bis(trifluoromethyl)-phenyl | CN |
| 4-cyano-3-(trifluoromethyl)-phenyl | 3,5-bis(trifluoromethyl)-phenyl | H |
| 4-cyano-3-(trifluoromethyl)-phenyl | pentafluoroethyl | H |
| 3,5-bis(trifluoromethyl)-phenyl | pentafluoroethyl | CN |
| 4-cyano-2,6-bis(trifluoromethyl)-phenyl | 4-cyano-2,6-bis(trifluoromethyl)-phenyl | H |
| 4-cyano-2,6-bis(trifluoromethyl)-phenyl | pentafluoroethyl | H |
| 2,4-bis(trifluoromethyl)-phenyl | 2,6-bis(trifluoromethyl)-phenyl | H |
| 2,4-bis(trifluoromethyl)-phenyl | 2,6-bis(trifluoromethyl)-phenyl | CN |
| 4-(3',5'-bis(trifluoro-methyl)phenyl)-2,6-bisftrifluoromethyl)-phenyl | pentafluoroethyl | H |
| phenyl | phenyl | CN |
| 3,5-bis(trifluoromethyl)-phenyl | 3,5-bis(trifluoromethyl)-phenyl | $CF_3$ |
| 3,5-bis(trifluoromethyl)-phenyl | trifluoromethyl | $CF_3$ |

-continued

| $R^1$ | $R^2$ | $R^3$ |
|---|---|---|
| phenyl | pentafluoroethyl | $CF_3$ |
| 3,5-bis(trifluoromethyl)-phenyl | pentafluoroethyl | $CF_3$ |
| 3,4,5-trifluorophenyl | 3,4,5-trifluorophenyl | $CF_3$ |
| 4-(trifluoromethyl)phenyl | 4-(trifluoromethyl)phenyl | $CF_3$ |
| phenyl | phenyl | $CF_3$. |

10. The electronic component according to claim 1, wherein $L_1$, $L_2$, $L_3$ and $L_4$ have the same meanings.

11. The electronic component according to claim 1 in form of an organic light-emitting diode, an organic solar cell, a photovoltaic cell, an organic diode or an organic transistor, or a Perovskite solar cell.

12. The electronic component according to claim 1, comprising an electron transport layer, which comprises at least the compound of formula (I.1).

* * * * *